(12) United States Patent
Hines

(10) Patent No.: US 9,910,156 B2
(45) Date of Patent: Mar. 6, 2018

(54) USING OPTICAL PROXY LIGHT TO AIM REDIRECTED LIGHT AT A TARGET USING HELIOSTATS

(71) Applicant: SOLARRESERVE, LLC, Santa Monica, CA (US)

(72) Inventor: Braden E. Hines, Pasadena, CA (US)

(73) Assignee: SOLARRESERVE TECHNOLOGY, LLC, Santa Monica, CA (US)

(*) Notice: Subject to any disclaimer, the term of this patent is extended or adjusted under 35 U.S.C. 154(b) by 0 days.

(21) Appl. No.: 14/411,887

(22) PCT Filed: Jun. 27, 2013

(86) PCT No.: PCT/US2013/048267
§ 371 (c)(1),
(2) Date: Dec. 29, 2014

(87) PCT Pub. No.: WO2014/004882
PCT Pub. Date: Jan. 3, 2014

(65) Prior Publication Data
US 2015/0160345 A1 Jun. 11, 2015

Related U.S. Application Data

(60) Provisional application No. 61/666,827, filed on Jun. 30, 2012.

(51) Int. Cl.
G02B 19/00 (2006.01)
G01S 17/66 (2006.01)
(Continued)

(52) U.S. Cl.
CPC ............. G01S 17/66 (2013.01); G02B 5/09 (2013.01); G02B 19/0042 (2013.01);
(Continued)

(58) Field of Classification Search
CPC .. F24J 2/407; F24J 2/10; G01S 3/7861; G02B 19/0042; G02B 19/0019
(Continued)

(56) References Cited

U.S. PATENT DOCUMENTS 4,349,733 A  9/1982  Beam et al.
4,519,382 A * 5/1985  Gerwin .................. F24J 2/07
                                            126/578
(Continued)

FOREIGN PATENT DOCUMENTS

CN    1515917        7/2004
CN    101918769 A   12/2010
(Continued)

OTHER PUBLICATIONS

European Patent Application No. 13741310.0; Extended Search Report issued Oct. 26, 2015.
(Continued)

Primary Examiner — Que T Le
(74) Attorney, Agent, or Firm — Kagan Binder, PLLC

(57) ABSTRACT

The present invention is directed to systems, devices and methods utilizing a proxy device that indicates directional aspects of redirected light from a corresponding light redirecting element by the position of one or more redirected light beams in one or more directions or coordinates on such a proxy device. The position characteristics of light redirected from the proxy device correlate to the aim of the light redirecting element associated with the proxy. This allows the proxy information to be used to accurately determine and control the aim of the light redirecting element.

20 Claims, 49 Drawing Sheets

(51) Int. Cl.
   *G02B 5/09* (2006.01)
   *H01L 31/054* (2014.01)
   *G02B 26/08* (2006.01)
   *F24J 2/10* (2006.01)

(52) U.S. Cl.
   CPC ...... *G02B 26/0816* (2013.01); *H01L 31/0547* (2014.12); *F24J 2/10* (2013.01); *F24J 2002/108* (2013.01); *Y02E 10/52* (2013.01)

(58) Field of Classification Search
   USPC ............ 250/203.4, 221, 214 R, 208.1; 126/573–576, 600–603, 906; 356/216, 356/445
   See application file for complete search history.

(56) References Cited

U.S. PATENT DOCUMENTS

| | | | |
|---|---|---|---|
| 4,874,937 | A | 10/1989 | Okamoto |
| 4,998,823 | A | 3/1991 | Kitajima |
| 5,282,016 | A | 1/1994 | Shen et al. |
| 5,670,774 | A | 9/1997 | Hill |
| 5,862,799 | A | 1/1999 | Yogev et al. |
| 6,174,648 | B1 | 1/2001 | Terao et al. |
| 6,923,174 | B1 | 8/2005 | Kurz |
| 9,010,317 | B1 | 4/2015 | Gross |
| 9,157,656 | B2 * | 10/2015 | Saeck ............... F24J 2/07 |
| 9,606,340 | B2 | 3/2017 | Hines et al. |
| 2004/0131483 | A1 | 7/2004 | Voulgaris |
| 2005/0274376 | A1 | 12/2005 | Litwin et al. |
| 2006/0098566 | A1 | 5/2006 | David et al. |
| 2006/0163446 | A1 | 7/2006 | Guyer et al. |
| 2006/0201498 | A1 | 9/2006 | Olsson et al. |
| 2006/0260605 | A1 | 11/2006 | Connor |
| 2007/0268585 | A1 | 11/2007 | Santoro et al. |
| 2009/0024987 | A1 | 1/2009 | Forster et al. |
| 2009/0052910 | A1 | 2/2009 | Schemmann et al. |
| 2009/0107485 | A1 | 4/2009 | Reznik et al. |
| 2009/0179139 | A1 | 7/2009 | Hines et al. |
| 2009/0249787 | A1 | 10/2009 | Pfahl et al. |
| 2010/0139644 | A1 | 6/2010 | Schwarzbach et al. |
| 2010/0252024 | A1 | 10/2010 | Convery |
| 2010/0263709 | A1 | 10/2010 | Norman et al. |
| 2011/0000478 | A1 | 1/2011 | Reznik |
| 2011/0120448 | A1 | 5/2011 | Fitch et al. |
| 2011/0155119 | A1 | 6/2011 | Hickerson et al. |
| 2011/0216535 | A1 | 9/2011 | McEntee |
| 2011/0238218 | A1 | 9/2011 | Lee et al. |
| 2011/0265783 | A1 | 11/2011 | Yatir |
| 2011/0317876 | A1 | 12/2011 | Bender |
| 2012/0132194 | A1 | 5/2012 | Saeck et al. |
| 2012/0145143 | A1 | 6/2012 | Hoffschmidt et al. |
| 2012/0174909 | A1 | 7/2012 | Koningstein et al. |
| 2014/0110560 | A1 | 4/2014 | Hines et al. |
| 2016/0195302 | A1 | 7/2016 | Hines et al. |

FOREIGN PATENT DOCUMENTS

| | | |
|---|---|---|
| CN | 1353819 | 6/2012 |
| DE | 10 2009 037280 A1 | 4/2011 |
| WO | 2009/055624 A1 | 4/2009 |
| WO | 2010048589 A2 | 4/2010 |
| WO | 2010101468 | 9/2010 |
| WO | WO 2011/018367 | 2/2011 |
| WO | 2012125748 | 9/2012 |
| WO | 2012125751 | 9/2012 |
| WO | WO 2012/125748 | 9/2012 |
| WO | WO 2012/125751 | 9/2012 |

OTHER PUBLICATIONS

Sargent & Lundy LLC Consulting Group, "Assessment of Parabolic Trough and Power Tower Solar Technology Cost and Performance Forecasts," Oct. 2003, 344 pages.

How it Works, Heliostat, "Hands Down the Cheapest Way to Gather the Suns Energy," http://www.heliostat.us/howitworks.htm, pp. 1-3 (no date).

* cited by examiner

USING OPTICAL PROXY LIGHT TO AIM REDIRECTED LIGHT AT A TARGET USING HELIOSTATS

PRIORITY

This application claims priority to International Application No. PCT/US2013/048267, filed on Jun. 27, 2013, which in turn claims priority under 35 U.S.C. § 119(e) to U.S. provisional application No. 61/666,827, titled "Position-Encoded Optical Proxy for Sensing and Pointing of Light Sources", filed Jun. 30, 2012, wherein these applications are incorporated herein by reference in their entireties for all purposes, respectively.

FIELD OF THE INVENTION

The present invention relates to proxy elements and associated systems that use positional characteristics of light on at least one proxy element to help aim light redirected from a light redirecting element onto a target. More specifically, these strategies are used to controllably aim heliostats in the field of concentrating solar power (CSP).

BACKGROUND OF THE INVENTION

The use of heliostats in the field of concentrating solar power (CSP) is well established in the prior art. A typical CSP system includes at least one centralized tower and a plurality of heliostats corresponding to each centralized tower. The tower is centralized in the sense that the tower serves as the focal point onto which a corresponding plurality of heliostats collectively redirect and concentrate sunlight onto a target (also referred to as a focus or a receiver) associated with the tower. The concentration of sunlight at the tower receiver is therefore directly related to the number of heliostats or other concentrators associated with the tower up to certain fundamental limits. This approach can concentrate solar energy to very high levels, e.g., on the order of 1000× or more if desired. In practical application, many systems concentrate sunlight in a range from 50× to 5000×. The high concentration of solar energy can then be converted by the tower receiver into other useful forms of energy. One mode of practice converts the concentrated solar energy into heat to be used either directly or indirectly, such as by generating steam, to power electrical generators, industrial equipment, or the like. In other modes of practice, concentrated solar energy can be converted directly into electricity through the use of any number of photovoltaic devices, also referred to as solar cells.

Heliostats generally include a light redirecting element (e.g., a mirror or other suitable optical device) to redirect sunlight to a target. A heliostat also typically includes support structure for holding the mirror and allowing the mirror to be articulated, such as under the control of actuators such as motors to effect articulation. At a minimum, heliostats desirably provide two degrees of rotational freedom in order to redirect sunlight onto a fixed tower focus point. Heliostat mirrors may be planar, but could possibly have more complex shapes.

Heliostat articulation can follow an azimuth/elevation scheme by which the mirror rotates about a fixed axis perpendicular to the earth's surface for the azimuth and then rotates about an elevation axis that is parallel to the earth's surface. The elevation axis is coupled to the azimuth rotation such that the direction of the elevation is a function of the azimuth angle.

Alternatively, heliostats can articulate using a tip/tilt scheme in which the mirror rotates about a fixed tip axis that is parallel to the earth's surface and a further tilt axis. The tip axis often is orthogonal to the tilt axis but the tilt axis of rotation tips as a function of the tip axis rotation. The tilt axis is parallel to the earth's surface when the heliostat mirror normal vector is parallel to the normal vector of the earth's surface. Other schemes, such as polar tracking and many others, are also possible.

In typical operation, heliostats are pointed so that the reflected sunlight impinges on a target, such as the central tower receiver, which often is fixed in space relative to the heliostat. Because the sun moves relative to the heliostat site during the day, the heliostat reflectors often track the sun appropriately to keep the reflected light aimed at the receiver as the sun moves.

FIG. 1 schematically illustrates a typical CSP system 403. CSP system 403 has tower 405 with focus region 407 and one of a plurality of corresponding heliostats 409 (only one of which is shown for purposes of illustration) that aim reflected sunlight at region 407. Sunlight as represented by a vector 411 reflects off the heliostat mirror 413 as the mirror 413 is oriented with a surface normal that is represented by a vector 415. Mirror 413 is accurately aimed so that reflected sunlight according to vector 417 is aimed at focus 407 generally along heliostat focus vector 419, which is the line of sight from the heliostat mirror 413 to the tower focus 407. If mirror 413 were to be aimed improperly so that vector 417 was not aimed at focus 407, these two vectors 417 and 419 would diverge from one another. In order that the reflected light 417 impinges on the tower focus 407, the laws of reflection require that the angle formed between the sunlight vector 411 and mirror normal vector 415 must be equal to the angle formed between heliostat focus vector 419 and mirror normal vector 415. Further, all three vectors 411, 415, and 419 must lie in the same plane. It can be shown using vector algebra that given a sunlight vector 411 and desired focus vector 419, there is a unique solution for mirror normal vector 415 that is simply the normalized average of vectors 411 and 419.

Generally, control strategies use open loop control, closed loop control, or combinations of these. Many heliostat control systems, though, employ open loop algorithms based on system geometry and sun position calculators in order to determine the sun and heliostat-focus vectors as a function of time. These calculations result in azimuth/elevation or tip/tilt commands to each heliostat device. Such control systems generally assume that the locations of the heliostats are static and well defined and/or otherwise rely on periodic calibration maintenance to correct for settling and other lifetime induced drifts and offsets. Open loop solutions are advantageous in that they do not require any feedback sensors to detect how well each heliostat is pointed. These systems simply tell every heliostat how to point and assume that the heliostats point correctly. A major drawback is that open loop systems demand components made with high precision if accuracy is to be realized. Incorporating precision into the system components can be very expensive. Additionally, it can be costly to perform the precise surveying of the heliostat locations that is needed to perform open loop calculations with sufficient accuracy. The expense of precision and surveying escalates as the number of heliostats in a heliostat field increases. Consequently, systems that rely only on open loop control tend to be too expensive. Such systems also tend to use a lesser number of very large heliostats in order to keep surveying expenses low and to minimize the number of precision components and precision operations required.

Closed loop control strategies have typically proven difficult to apply to heliostat systems. Closed loop heliostat control would need to rely on feedback from one or more sensors capable of measuring differences, or errors, between a desired condition and an actual condition. These errors are then processed into compensation signals to heliostat actuators to articulate the mirrors so that reflected sunlight impinges on the target or tower focus. Closed loop pointing has an advantage that it does not require precise components or installation or knowledge of the system geometry. The system also can be made less sensitive to lifetime drifts. Less demand for precision means that these systems are much less expensive than systems that rely solely on open loop control. Closed loop systems offer the potential to use control software rather than predominantly precision techniques, and control is less expensive to implement than precision techniques.

A difficulty in applying closed loop pointing methods on CSP systems results from a pointing condition, such as described above, requiring the bisection of two vectors rather than alignment to a single vector. That is, as shown in FIG. 1, during normal operation, the heliostat mirror 413 itself doesn't point at anything in particular—rather, it must point in a direction 415 in between the sun 411 and the target 407, and the direction 415 changes with time as the sun moves. Nominally, there is nothing in that direction but empty sky, so there is nothing for a traditional closed loop tracking system to point the mirror at.

The ideal closed loop heliostat tracking system should sense the difference between the reflected sunlight vector 417 and the line of sight vector 419, and endeavor to control that difference to zero. Thus, CSP and concentrated photovoltaic (CPV) system designers have contemplated that an ideal location for a feedback sensor would be to place the sensor in the path of the reflected beam, such as at the tower focus 407. Unfortunately, this is not feasible because no practical sensor could withstand the extreme temperatures or the UV dosage that result from highly concentrated sunlight. This poses a significant technical challenge of how to sense and correct the aim of a beam if the beam cannot be safely sensed.

Other schemes are possible, albeit less desirable. For example, one prior art system (http://www.heliostatus/howitworks.htm) discloses a sensor that controls reflected sunlight vector 417 to be aligned with a third vector, the axis of a sensor near the heliostat. During installation of the system, the sensor is aligned with the line of sight vector 419. The accuracy of the system is thus dependent on the accuracy of this alignment, and on the alignment remaining unchanged. In large CSP systems, however, this may be insufficient for several reasons; for example, the tower 405 may sway in the wind or experience thermal expansion or contraction. Cost may also be an issue, since each heliostat requires a separate sensor, and since each sensor must be individually aligned to the tower.

A second type of "closed loop" heliostat system that is common in the prior art is a system that senses the orientation of the heliostat axes with respect to the heliostat base. The control system then provides corrections to any detected errors in the orientation of these axes. This type of system mitigates errors in the gear train of the heliostat, but it does not sense the reflected sunlight vector 417 at all. This system is susceptible to any unseen errors in this vector, and it is blind to any errors in the alignment of reflected sunlight vector 417 to line of sight 419. This system thus likewise may be sensitive to motions of the tower and long-term drifts. Practical systems tend to include elaborate calibration schemes to deal with these issues. Cost also is impacted, since encoders are needed for each axis of each heliostat.

Applicants' co-pending application PCT/US12/29106, filed Mar. 14, 2012, and titled OPTICAL PROXY FOR SENSING AND POINTING OF LIGHT SOURCES discloses closed loop pointing systems that use one or more optical proxies to distribute and/or modify one or more properties of light such as intensity characteristics, helping to provide a signal that can be used to sense the direction of light from a light redirecting element. See also Applicant's co-pending PCT application PCT/US12/29110, filed Mar. 14, 2012, and titled APPARATUS AND METHOD FOR POINTING LIGHT SOURCES. Each of the PCT applications PCT/US12/29110 and PCT/US12/29106 is fully incorporated herein by reference in its respective entirety.

Under some conditions, it can be difficult to assess intensity characteristics, however. Consequently, there remains a strong need for additional techniques that would allow closed loop control of heliostat systems to be more feasible, such as using other types of feedback information to point reflected sunlight vector 417 to target 407 along line of sight 419.

SUMMARY OF THE INVENTION

The present invention relates to apparatus and methods to provide a closed loop pointing system for the purpose of redirecting light from a source onto a target. Whereas the principles of the invention disclosed herein are presented in the context of concentrating solar power, the apparatus and methods are generally applicable to any pointing system in which light is redirected onto one or more fixed and/or moving targets.

The present invention appreciates that one useful property of redirected light that can be readily measured with respect to a suitable surface is the position(s) from which the redirected light appears to emanate from the surface when viewed or otherwise sensed from particular point(s) of observation. Consequently, such an observed or otherwise sensed point of emanation appears as a position of a light spot on the surface. The observed position of the light spot(s) on the surface is thus a characteristic of the redirected light.

As such a surface articulates relative to the light source (which is the sun in the case of a heliostat system), and when viewed from the same point(s) of observation, the observed position of the light spot(s) on the surface may correspondingly move, in a way that is related to the shape of the surface. The present invention appreciates, therefore, that the observed position of a light spot on the surface can be used to determine how the surface is articulated, i.e., aimed, relative to the light source and/or one or more targets. In the case of a heliostat system, the target often is a receiver on a tower onto which redirected sunlight is concentrated from a heliostat field.

The present invention further appreciates that such a surface can be used as an optical proxy device associated with one or more light redirecting elements, such that position of the light spot(s) on the proxy device as sensed from at least one viewpoint correlates to the aim of the light redirecting element(s) associated with the optical proxy device.

This allows the position of light spot(s) on proxy devices to be used in feedback control systems to accurately determine and control the aim of light redirecting elements associated with the proxy devices. The system allows dynamic, real-time control, so that the aim of heliostats can be adjusted as needed as the sun moves through the sky as the day progresses. Although it is difficult to sense the redirected sunlight of light redirecting elements directly due to the impracticality of placing a sensor in the path of concentrated sunlight, it is much more practical to sense light information produced by the proxy from more practical point(s) of observation. Then the proxy information is used to aim the light redirecting elements. Consequently, systems, devices and methods of the present invention are described herein that utilize closed loop tracking systems for controlling redirected (e.g., reflected) light to a focal point.

The present invention can be incorporated into a wide range of heliostat systems for concentrating solar power. Exemplary systems include those in which the heliostat reflectors actuate by azimuth/elevation techniques, tip/tilt techniques, combinations of these, and the like.

In one aspect, the present invention relates to a heliostat system, comprising:
  (a) A plurality of heliostats, each heliostat comprising:
    i) a light redirecting element that redirects incident sunlight;
    ii) at least one optical proxy associated with the light redirecting element, wherein position characteristics of light on the proxy device as sensed from at least one viewpoint correlate to the aim of the light redirecting element associated with the proxy; and
  (b) a control system that uses the position characteristics of light on the optical proxies to aim and concentrate the redirected sunlight onto at least one target.

In another aspect, the present invention relates to a method of concentrating sunlight, comprising the steps of:
  (a) providing a light redirecting element;
  (b) providing at least one optical proxy associated with the light redirecting element, wherein position characteristics of light on the at least one optical proxy as sensed from a viewpoint correlate to the aim of the light redirecting element associated with the proxy;
  (c) sensing the position characteristics of light on the at least one optical proxy;
  (d) using the sensed information to aim the light redirecting element in a manner that redirects the sunlight at a target; and
  (e) repeating steps (a) through (d) for at least one additional light redirecting element and at least one additional optical proxy associated with the at least one additional light redirecting element.

In another aspect, the present invention relates to a method of redirecting sunlight, comprising the steps of:
  (a) obtaining information indicative of a position of light on at least one optical proxy; and
  (b) using the position information to aim at least one light redirecting element associated with the at least one optical proxy in a manner that redirects the sunlight at a target.

In another aspect, the present invention relates to a heliostat, comprising:
  (a) a light redirecting element; and
  (b) at least one optical proxy associated with the light redirecting element, wherein position characteristics of light on the proxy device as sensed from at least one viewpoint correlate to the aim of the light redirecting element associated with the proxy.

In another aspect, the present invention relates to a positional optical proxy for use as an indicator of angular positioning of a light redirecting element, the positional optical proxy comprising an optical surface, wherein the optical surface comprises a first surface portion that is sloped in a first direction so that as light impinges on the first surface portion, a visual indication will be created in a position defined by the slope in the first direction as a function of angular position of the proxy with respect to an observing device; and further wherein the optical surface comprises a second surface portion that is sloped in a second direction so as to broadcast redirected light in the second direction as a function of angular position of the proxy with respect to an observing device, whereby the positional optical proxy can be operatively associated with a light redirecting element and the movements thereof so as to provide angular positional information of the light redirecting element as a result of impingement of the optical proxy by light.

In another aspect, the present invention relates to a light redirecting device and optical proxy device combination for connection with a support structure including a mechanism for providing at least one axis of angular movement, the light redirecting device and optical proxy device combination comprising:
  (a) a light reflecting surface for directionally reflecting light based upon an angular position of the light redirecting element;
  (b) wherein the optical proxy device comprises a positional optical proxy operatively that is associated with and in a deterministic relationship to the light redirecting device and the movements thereof, the positional optical proxy comprising a plurality of optical surface portions wherein at least two optical surface portions are sloped in a first direction but at different angles so that as light impinges on the optical surface portions, a visual indication will be created in a position defined by the slope in the first direction of at least one of the portions as a function of angular position of the proxy and thus of the light redirecting element.

In another aspect, the present invention relates to a method of aligning a light redirecting device as connected to a support structure including a mechanism for providing at least one axis of angular movement, and wherein the light redirecting element comprises a light reflecting surface for directionally reflecting light based upon an angular position of the light redirecting device, the method including the steps of:
  (a) viewing a positional optical proxy as such is operatively associated with and in a deterministic relationship to the light redirecting device and movements thereof by an imaging device;
  (b) determining the position of a reflected light spot as reflected from the positional optical proxy;
  (c) based upon a first position of the reflected light spot of the positional optical proxy within an image captured by the imaging device, determining angular orientation information of the light reflecting surface and thus the light redirecting device;
  (d) moving the light redirecting device about at least one axis of angular movement; and
  (e) viewing the positional optical proxy a second time by the imaging device and based upon a second position of the reflected light spot of the positional optical proxy within a new image captured by the imaging device, determining new angular orientation information of the light reflecting surface and thus the light redirecting device.

DESCRIPTION OF THE INVENTION

Figure 1:
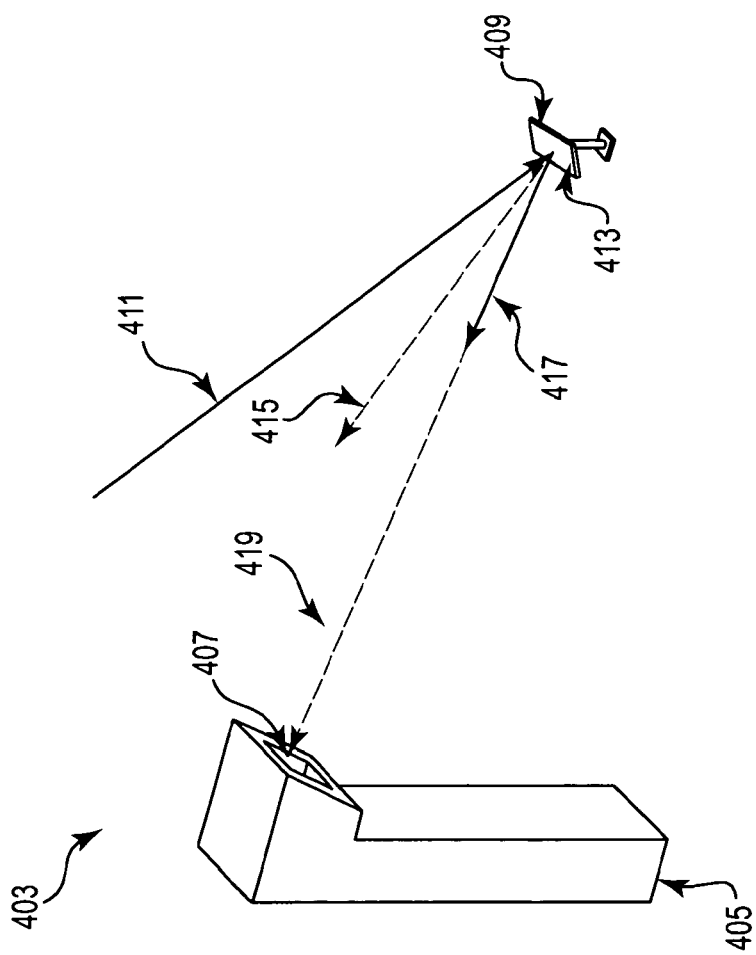
FIG. 1 illustrates a typical prior art concentrating solar power system.

Embodiments described herein are exemplary and do not represent all possible embodiments of the principles taught by the present invention. In particular, embodiments of the present invention have direct application in the field of concentrating solar power, particularly concentrating solar power including the use of heliostats to redirect sunlight onto a fixed focus in which concentrated sunlight may be converted into other forms of energy such as heat or electrical energy. Nevertheless, the apparatus and methods described herein can be applied and adapted by those skilled in the art for use in alternative applications in which light from a source must be redirected onto one or more targets, particularly light from a source that is not stationary.

An exemplary CSP system can include an array of heliostats that redirect and concentrate sunlight onto a focus area of a tower. An imaging subsystem comprising imaging detectors, such as cameras, can be mounted to the tower to detect positional properties of reflected light from one or more optical proxy elements as described below. The aim of the reflected light correlates to the position of light spot(s) on the proxy elements. Therefore, a control system (not shown) uses the detected light positional property information from the optical proxy in a closed loop control system to articulate and thereby aim redirected sunlight from the heliostats onto a focus area. The control system desirably comprises one or more computational devices (not shown) coupled electronically to the imaging subsystem and the heliostats. The control system can include software to process positional property information such as is acquired by an imaging subsystem in order to effect articulation of one or more of the plurality of heliostats for the purpose of controllably redirecting sunlight onto the system focus area.

Within a CSP system utilizing aspects of the present invention, each heliostat preferably comprises at least one optical proxy device, along with at least one light redirecting element in the form of a reflecting element such as a mirror, and a support structure including pivot mechanisms. An optical proxy and its associated reflecting element(s) form an assembly that can be articulated so that the assembly can track the sun and aim redirected sunlight onto a focus area, such as provided by a target (e.g., a receiver) on a tower. An optical proxy is preferably coupled to a reflecting element so that optical information that is produced from the optical proxy can be used to determine the angle of light reflected by the reflecting element. This allows the reflecting element to be controllably aimed via an aiming strategy that includes closed loop control techniques optionally in combination with other control strategies, e.g, open loop control and/or feedforward techniques. In particular, an imaging subsystem that may comprise one or more cameras is provided to detect optical information, such as positional properties of light that are produced by an optical proxy.

Figure 2:
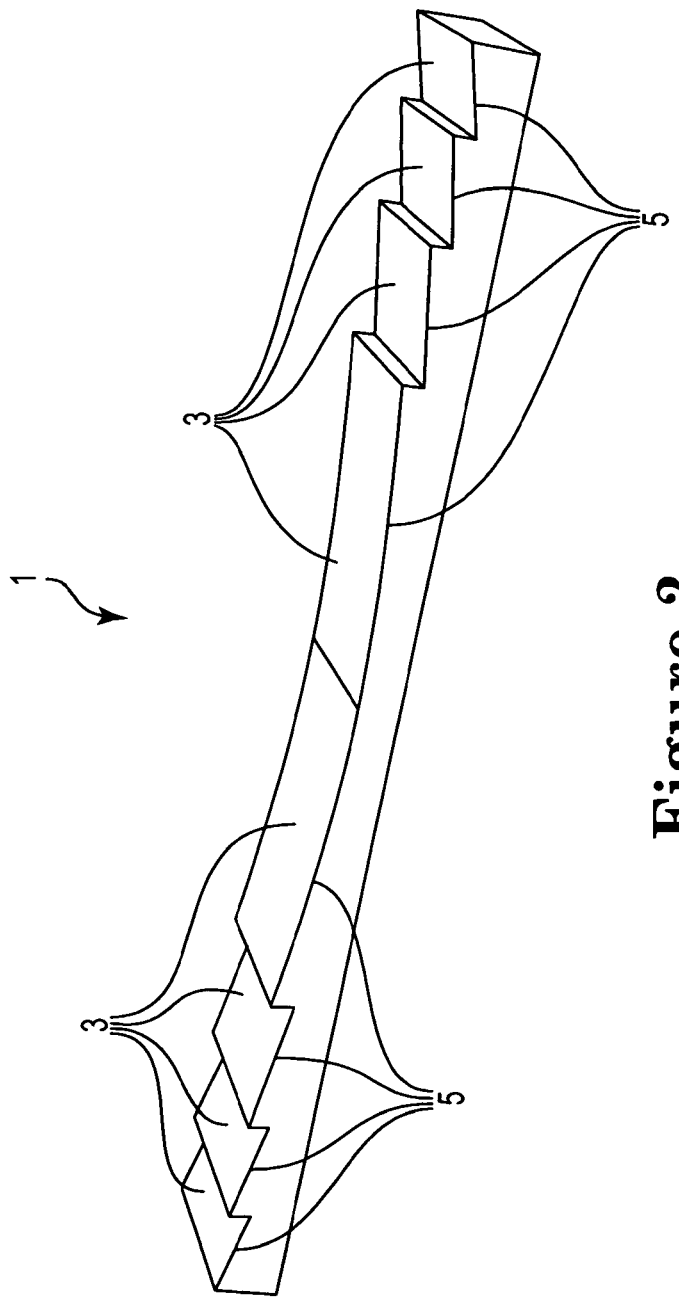
FIG. 2 is a limited positional optical proxy according to the present invention, with the vertical dimension exaggerated slightly for clarity.

A first aspect in accordance with the present invention is illustrated in FIG. 2 as comprising a faceted reflecting optical proxy 1. In practice, the reflector 1 is mounted on or otherwise in association with a corresponding light re-directing element (not shown) to serve as an optical proxy for the light re-directing element. The faceted proxy 1 of FIG. 2 is a limited version of a positional optical proxy in accordance with aspects of the present invention in that the reflector reflects light substantially in a plane in space, meaning that such reflected light is visible from only a limited angular extent about the proxy. Within this angular extent, a light spot is viewable on the proxy 1, and the position of the light spot on reflector 1 correlates to the aim of the light-directing element. Determining the position of the light spot on the reflector 1 allows the aim of the light re-directing element to be determined and corrected as desired. Other embodiments of proxy devices described below allow reflected light to be viewed from a greater range of angles.

The proxy 1 shown in FIG. 2 comprises a surface 3 whose slope is zero near the center and increases generally monotonically as the distance from the center increases. In the embodiment shown in FIG. 2, the surface 3 comprises a set of facets 5. Faceting is not required by the invention, but it is understood that faceting can help to make an optical proxy that is more flat, e.g., it has a lower profile viewed from the side, which may have numerous advantages.

Figure 3:
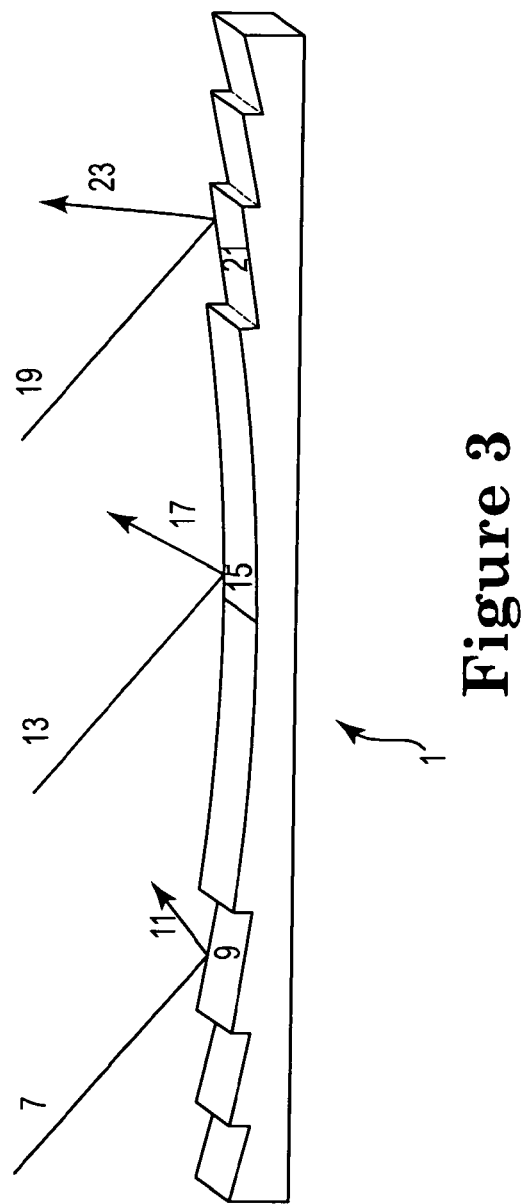
FIG. 3 illustrates how light from a light source is reflected to different angles depending on where it strikes the limited positional optical proxy, with the vertical dimension of the limited proxy exaggerated slightly for clarity.

FIG. 3 illustrates a limited positional optical proxy 1 that is under illumination by a distant light source with rays 7, 13, and 19, impinging on points 9, 15, and 21 respectively, resulting in reflected rays 11, 17, and 23. While the incoming rays from the distant light source may be generally parallel, the varying slope of the reflective surface of the limited optical proxy 1 means that the reflected rays tend to have a diversity of angles.

Figure 4:
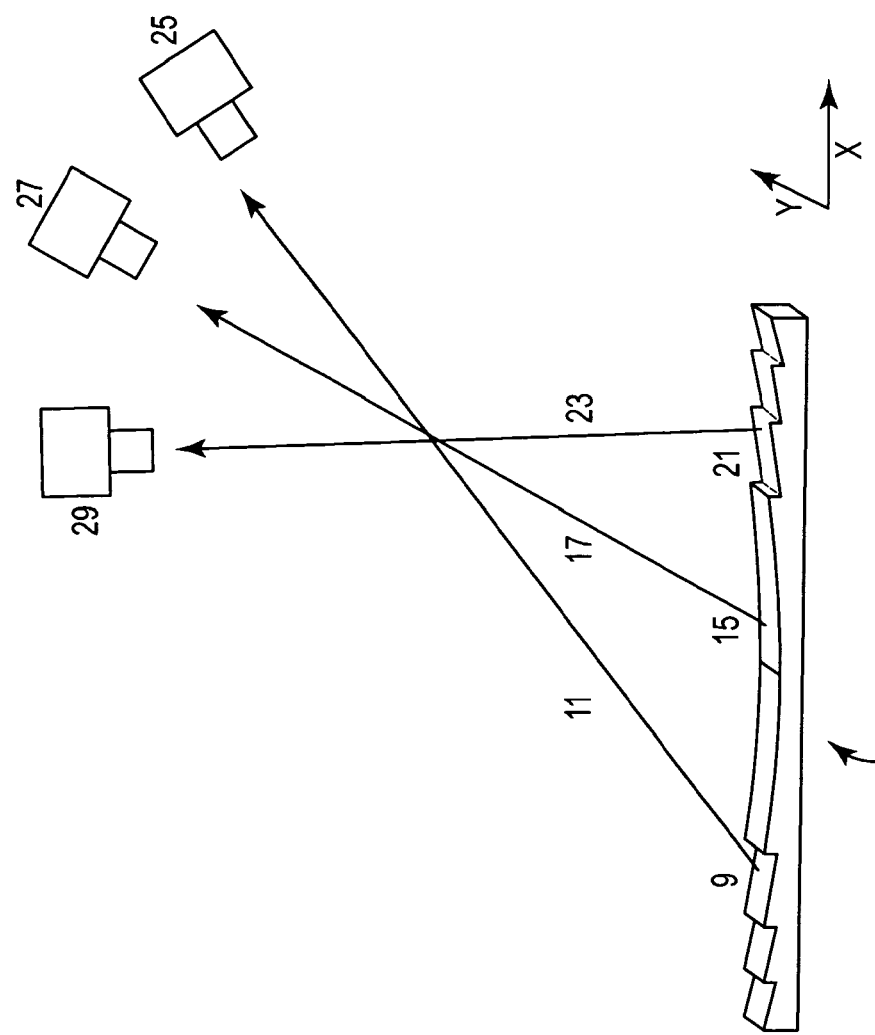
FIG. 4 illustrates a set of cameras observing the reflected light from the limited positional optical proxy. The vertical dimension of the limited proxy is exaggerated slightly for clarity.

FIG. 4 is a zoomed-out view of FIG. 3 (omitting the incident rays 7, 13, and 19 for clarity) that illustrates how such an optical element is in a basic aspect functional as an optical proxy. Three cameras 25, 27, and 29 are illustrated, for example, in order to observe the optical proxy element 1 from some distance. Camera 25, from its viewpoint, is able to observe ray 11, which appears to emanate from point 9. Likewise, camera 27 observes ray 17 emanating from point 15, and camera 29 observes ray 23 emanating from point 21.

Thus, although all three cameras are viewing reflections of the same light source, the x position of the reflection of that light source appears to move depending on where the camera is located. The locations of points 9, 15, and 21 also would be different if the light source (not shown) were to move.

Figure 5:
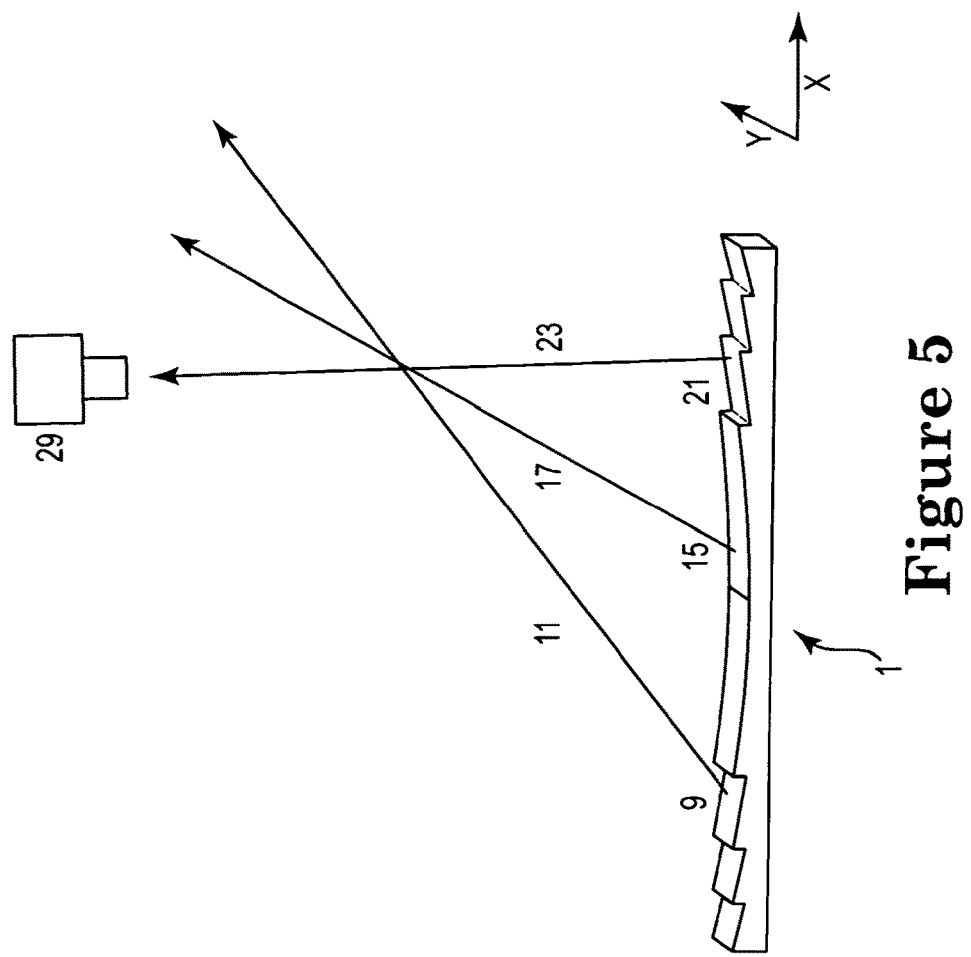
FIG. 5 illustrates a single camera observing the reflected light from the limited positional optical proxy, with the limited proxy at a first angle. The vertical dimension of the limited proxy is exaggerated slightly for clarity.
Figure 6:
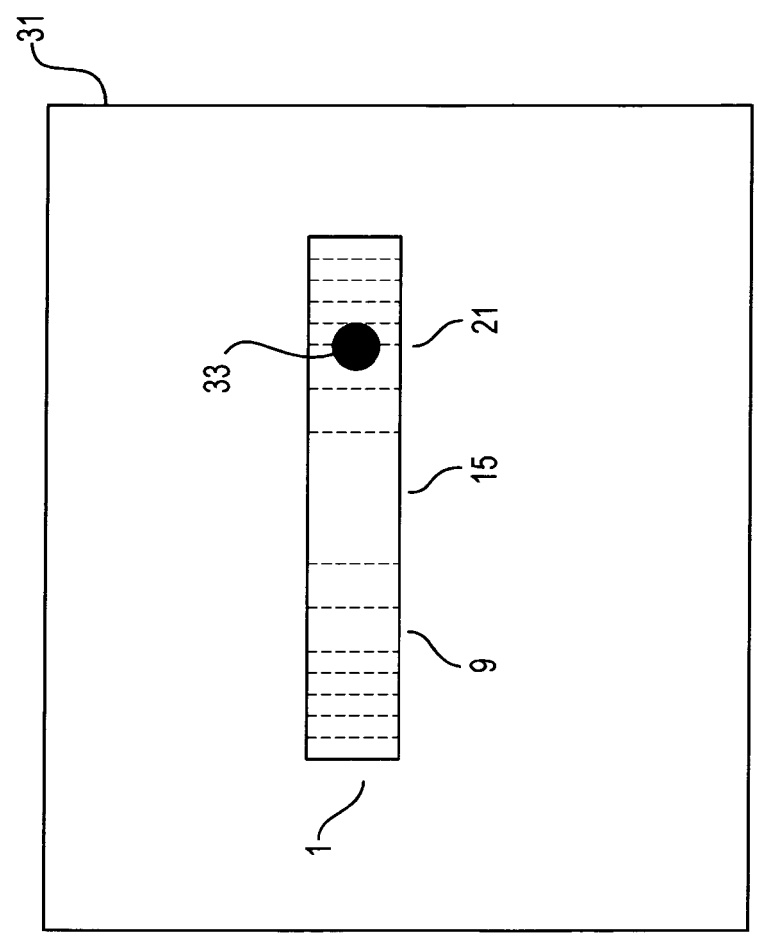
FIG. 6 shows a portion of the image observed by a camera observing the reflected light from the limited positional optical proxy, with the limited proxy at a first angle.

FIG. 5 shows a simplified view of FIG. 4, with just the single camera 29 shown. From the perspective of camera 29, the source of the light appears to be point 21 on the optical proxy 1. This positional aspect is further illustrated in FIG. 6, which represents a rectangular portion 31 of an image viewed or captured by camera 29. Proxy 1 is imaged as a rectangular patch in the detector, and a bright spot 33 of light is seen emanating from point 21. Light is not detected coming from points 9 or 15.

Figure 7:
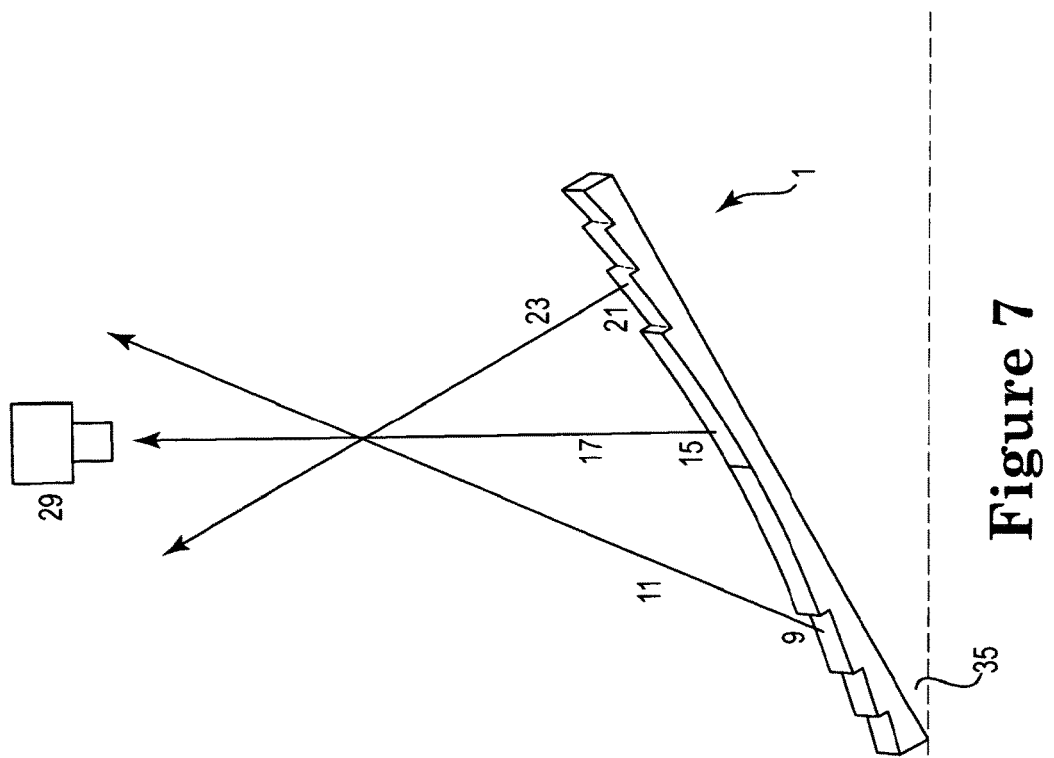
FIG. 7 illustrates a single camera observing the reflected light from the limited positional optical proxy, with the limited proxy at a second angle. The vertical dimension of the limited proxy is exaggerated slightly for clarity.
Figure 8:
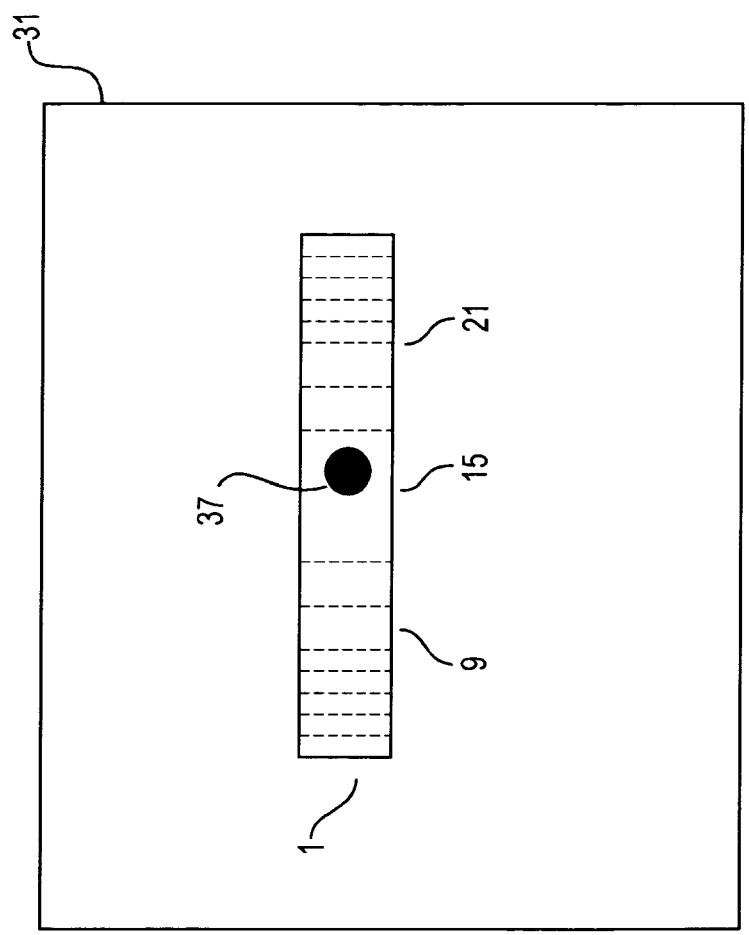
FIG. 8 shows a portion of the image observed by a camera observing the reflected light from the limited positional optical proxy, with the limited proxy at a second angle.

FIGS. 7 and 8 show how proxy 1 operates as it tilts. FIG. 7 shows proxy 1 being rotated about an axis transverse to the proxy device 1 by an angle 35, which likewise causes a rotation of the reflected rays 11, 17, and 23. In the figure, proxy 1 is shown rotated by an amount such that camera 29 now sees reflected ray 17, appearing to emanate from point 15, rather than reflected ray 23. FIG. 8 illustrates the same rectangular portion 31 of the image as seen by camera 29 of the tilted proxy 1 of FIG. 7. The image of proxy 1 appears slightly shorter than before due to its tilt, and a bright spot 37 of light is now seen emanating from point 15.

Figure 9:
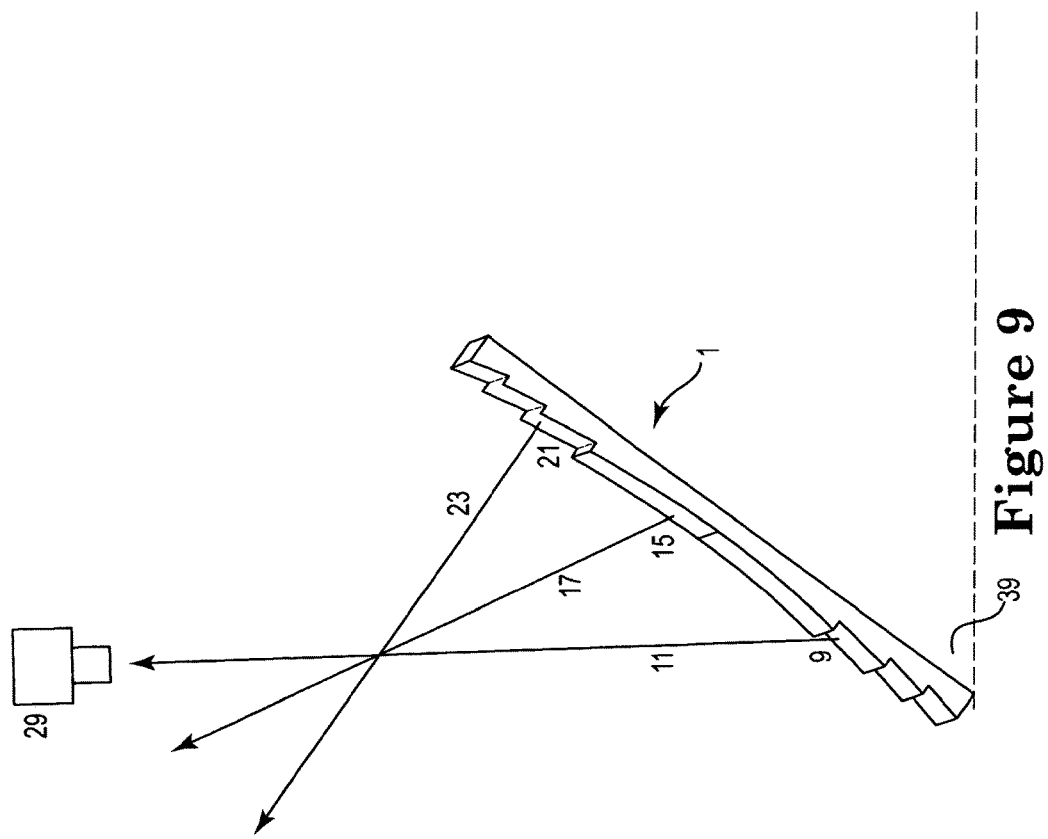
FIG. 9 illustrates a single camera observing the reflected light from the limited positional optical proxy, with the limited proxy at a third angle. The vertical dimension of the limited proxy is exaggerated slightly for clarity.
Figure 10:
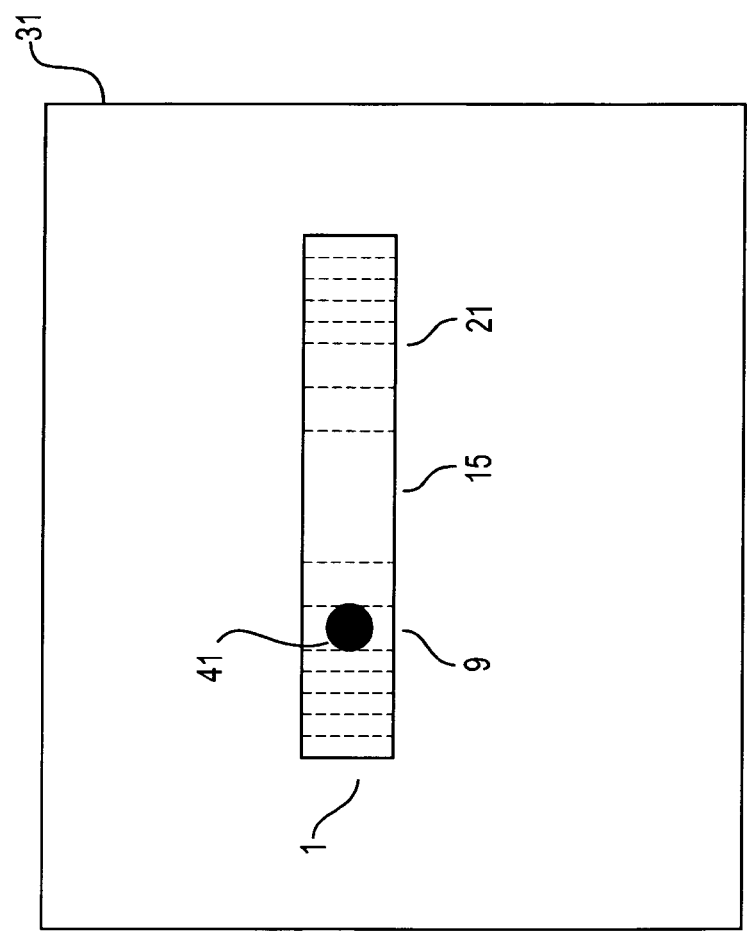
FIG. 10 shows a portion of the image observed by a camera observing the reflected light from the limited positional optical proxy, with the limited proxy at a third angle.

FIGS. 9 and 10 show the result when proxy 1 is tilted yet further from the position of FIG. 7 and in a similar manner, to an angle 39. In this case, camera 29 now sees reflected ray 11, and as shown in FIG. 10, it appears to emanate from point 9.

As such, it is apparent that the tilt of positional proxy 1 is encoded by the position of the spot on the proxy, starting with point 21 representing zero tilt, through point 9 representing tilt by angle 39.

As above, it is noted that the limited optical proxy 1, as discussed above, is functional as a positional optical proxy device that is limited because, while it is sensitive to tilt in one direction, it has a narrow angle of operation in an orthogonal tilt direction. To provide an optical proxy having a greater range of visibility from more viewing angles, an optical positional proxy of the present invention is preferably provided that has a non-flat structure in two dimensions, e.g. a concaove or convex bowl shape or other surface shapes as described below, so as to cast light more broadly into three dimensions. For example, such a proxy may broadcast reflected light outward in a cone, and so that the position of reflected light detected on the proxy correlates to the aim of the corresponding reflector in three dimensions.

Figure 11:
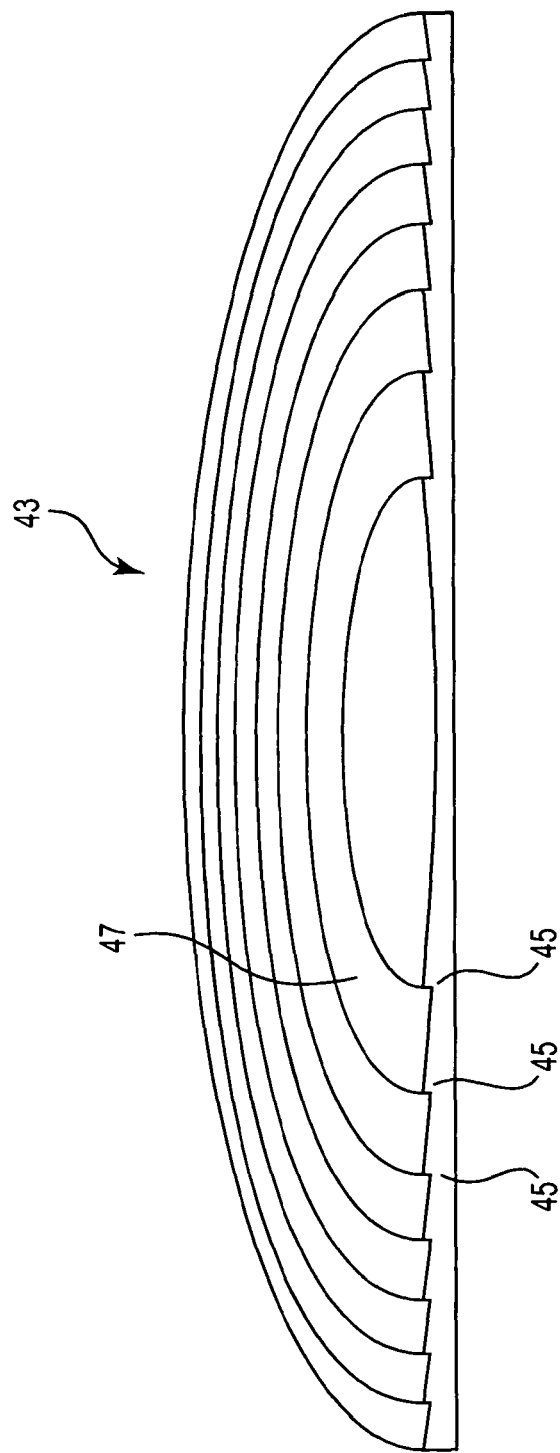
FIG. 11 shows a section view of a generally circular positional optical proxy. The vertical dimension of the optical proxy is exaggerated slightly for clarity.

One exemplary reflector 43 according to this principle is shown in section view in FIG. 11, comprising a concentric set of generally circular grooves 45, together forming a surface 47 whose slope is preferably zero near the center and that increases generally monotonically with increasing radius from the center. It is understood that such a reflector resembles a Fresnel lens in terms of having facets that increase in slope with increasing distance relative to a reference locus on the proxy, and is therefore referred to below as a "Fresnel-ized" reflector. The reflector has been Fresnel-ized in order to help keep it generally flat, which is advantageous for certain uses of the present invention.

Figure 12:
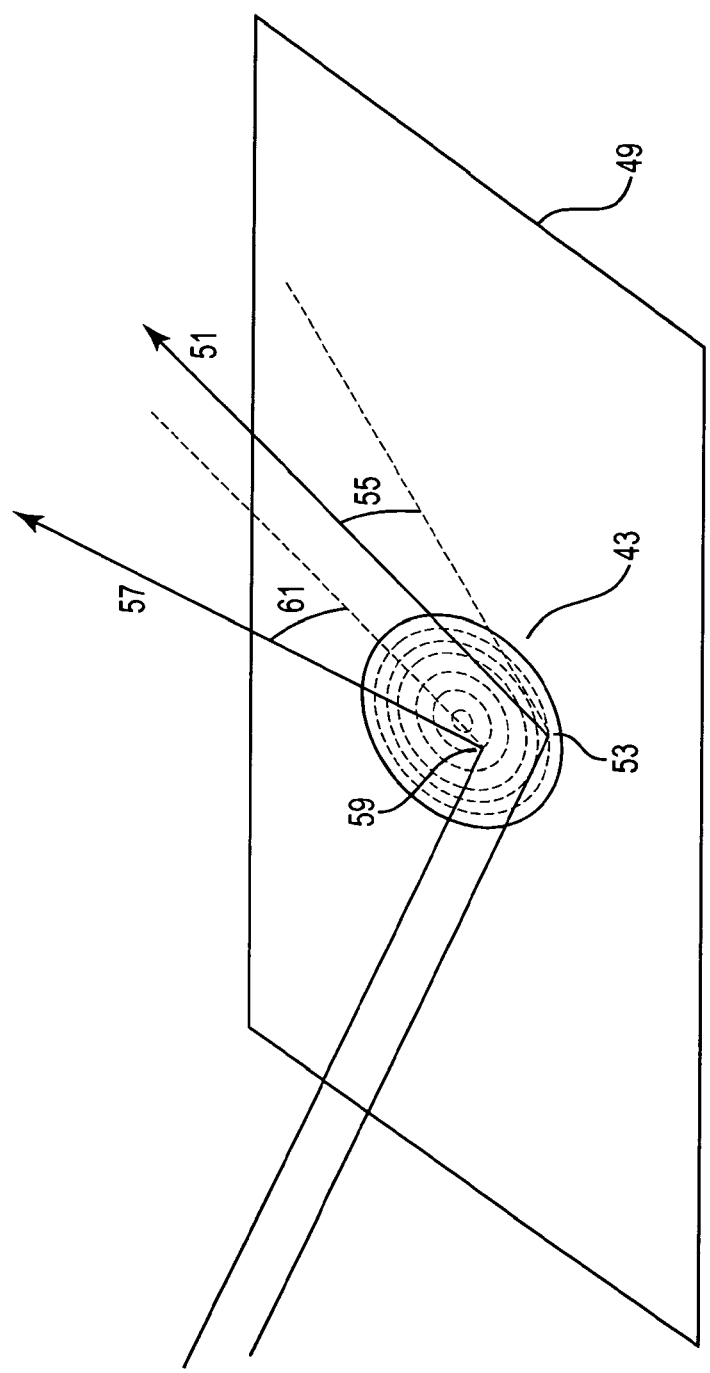
FIG. 12 shows a generally circular positional optical proxy distributing light into three dimensions, with the apparent source of the light being a function of the angle of the reflected ray.

FIG. 12 illustrates such an optical proxy as comprising a reflector 43 that is attached to a light redirecting element 49. When incoming light from a distant source strikes such a reflector 43 and its underlying light redirecting element 49, the reflector 43 redirects light over a continuum of angles in both axes, filling a cone in three-dimensional space with redirected light, as controlled by the slope of each of its surface portions so that different portions of the reflector redirect light at different angles as a function of position on the reflector 43. By way of example, proxy ray 51 is shown reflecting from position 53 with angle 55, while proxy ray 57 is shown reflecting from position 59 with angle 61.

Figure 13:
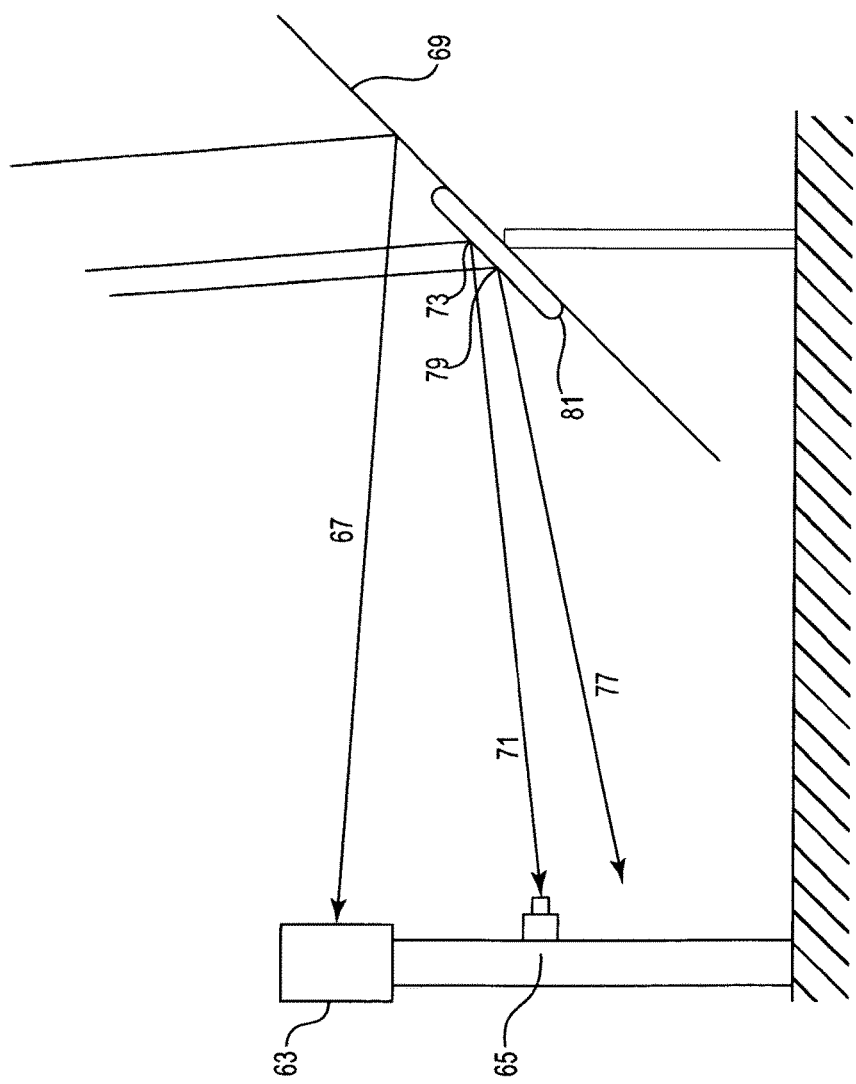
FIG. 13 shows a heliostat mirror with a positional optical proxy reflecting sunlight to a target and optical proxy light to a sensing camera. The sizes of the heliostat and proxy are greatly exaggerated for clarity.
Figure 14:
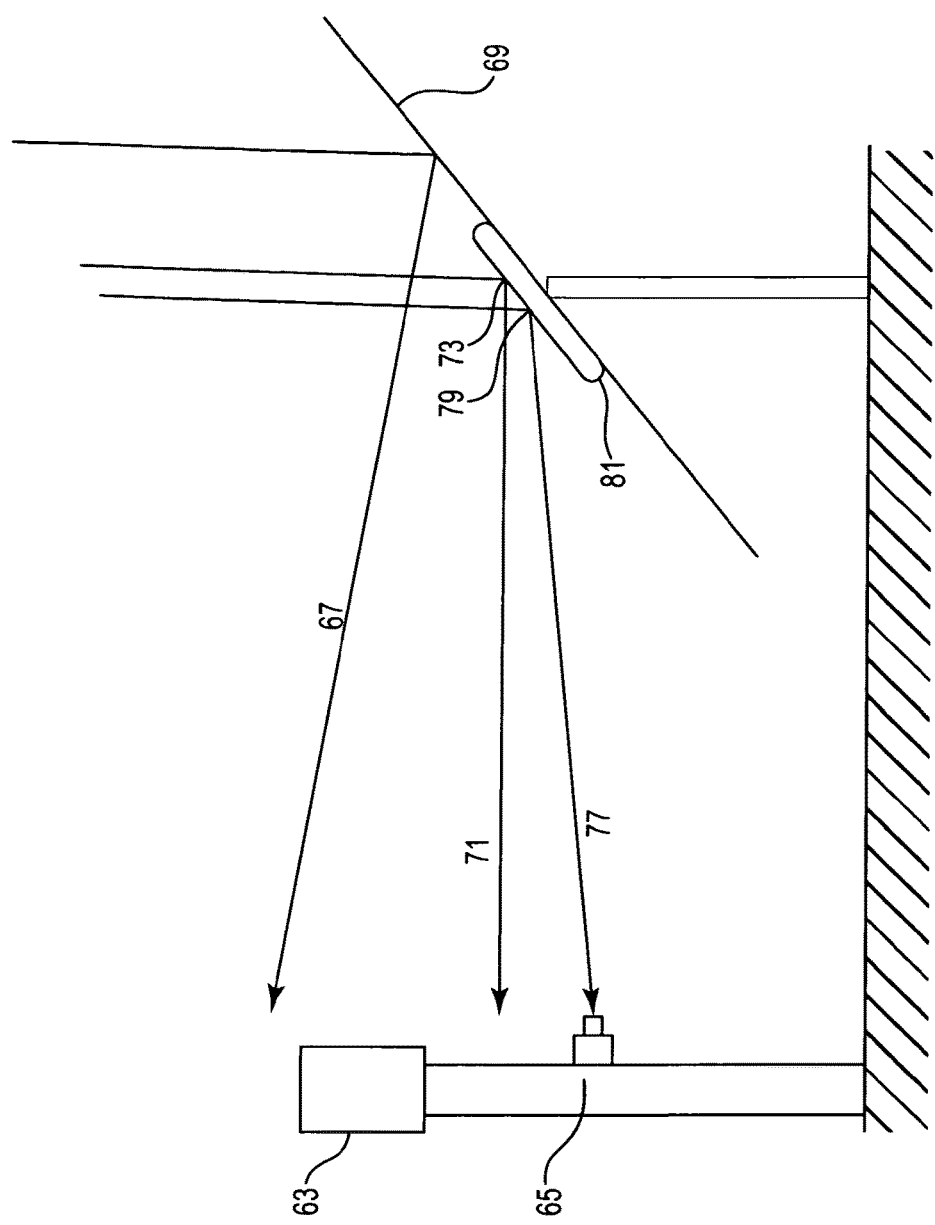
FIG. 14 shows a heliostat mirror with a positional optical proxy reflecting sunlight such that it misses the target, with optical proxy light being reflected to a sensing camera. The sizes of the heliostat and proxy are greatly exaggerated for clarity.

FIGS. 13 and 14 show this process in the context of a target 63 and an imaging or image capturing device, such as a sensing camera 65. In these figures, mirror 69 and proxy 81 are shown greatly exaggerated in size relative to the target, for clarity. In FIG. 13, when the chief ray 67 from mirror 69 is aligned with the target, sensing camera 65 sees proxy ray 71 reflecting from position 73 on proxy 81. FIG. 14, on the other hand, shows a case where chief ray 67 is not correctly aligned with the target, so sensing camera 65 instead sees proxy ray 77 reflecting from position 79 on proxy 81.

Using this information, a control system reading images from sensing camera 65 can determine the angle of chief ray 67 by observing the apparent position (e.g. position 73 or position 79) from which its observed proxy ray emanates and can use this information to control the pointing of mirror 69 to direct chief ray 67 to a desired target.

Figure 15:
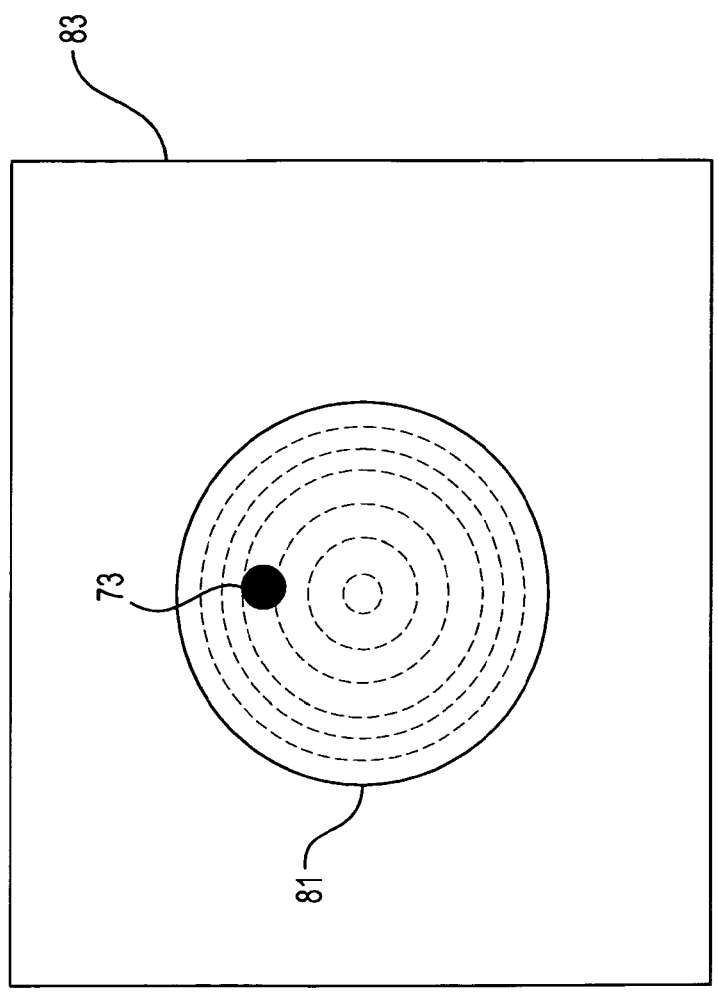
FIG. 15 shows a portion of the image seen by the sensing camera for the case of FIG. 13.
Figure 16:
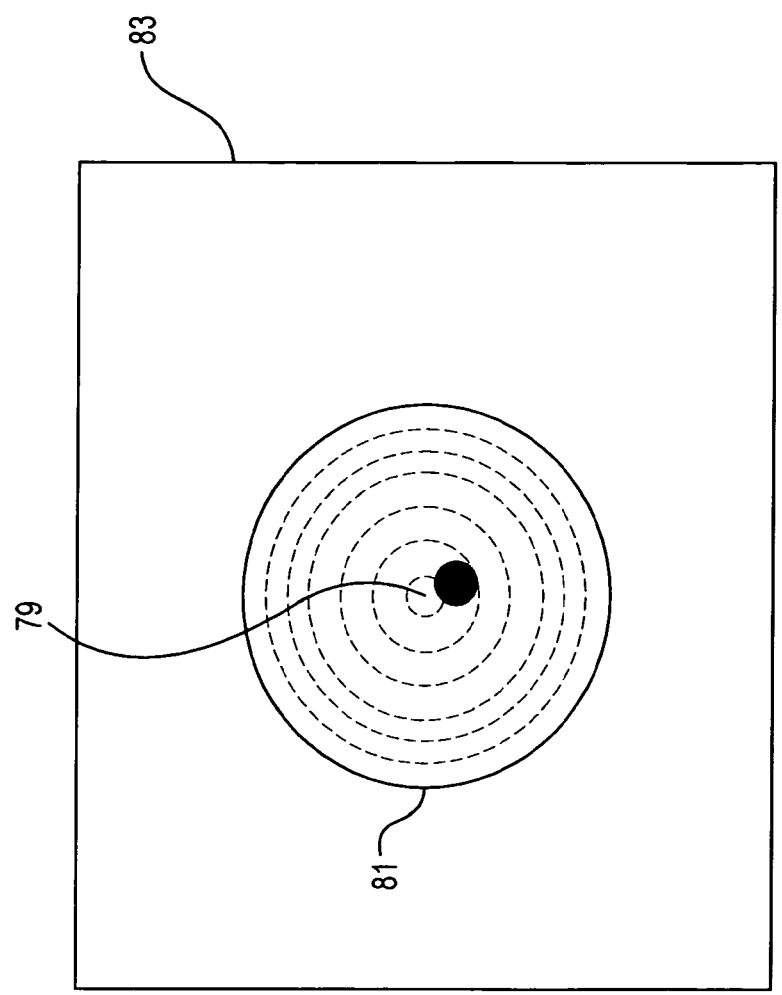
FIG. 16 shows a portion of the image seen by the sensing camera for the case of FIG. 14.

From the point of view of sensing camera 65, the camera 65 sees a spot on the optical proxy 81 whose position moves around deterministically as light redirecting element 69 articulates. Thus, the tip and tilt angles of light redirecting element 69 are encoded as some combination of the x and y positions of the spot as viewed by the camera 65 as such spot is viewed on the surface of the positional proxy 81 as the proxy itself articulates together with the surface of light directing element 69 to which it is affixed. This is shown in FIGS. 15 and 16, which correspond to the cases in FIGS. 13 and 14. FIGS. 15 and 16 are representations of a rectangular region 83 of the image as seen by sensing camera 65 for the two different cases of FIGS. 13 and 14. FIG. 15 illustrates a bright spot whose source is position 73, while FIG. 14 illustrates a bright spot whose apparent source is position 79.

In this regard, it is contemplated that the grooves need not be circular, but may be elliptical or any other convenient shape that covers two dimensions.

One particularly preferred shape for a positional proxy reflector and its grooves is the shape of a Fresnel-ized parabola. A parabolic surface has the property that its slope is proportional to the distance from the base of the parabola. Since the angle of reflection of the reflected beam is twice the inverse tangent of the slope of the surface, and since $\tan(\theta) \approx \theta$ for small angles, a Fresnelized parabola encodes the angle to the chief ray of the redirected beam as an approximately linear function of the angle.

In some embodiments, a transmissive optical proxy may be preferred. A Fresnel lens is an example of an optical proxy which, when used in a transmissive mode, will function similarly to the Fresnel-ized reflector in reflective mode. By way of example, a transmissive Fresnel lens may be used as a proxy with a light projection device, such as a theater spotlight. While the main transmitted beam will illuminate a target, such as an object on a stage, a proxy beam refracted from the transmissive Fresnel lens proxy can be detected by a sensing camera away from the stage. A seen by the sensing camera, a proxy spot will appear to move around on the surface of the Fresnel lens as the spotlight is articulated.

Embodiments disclosed thus far have illustrated an optical proxy that is attached directly to its associated light redirecting element. However, it is further contemplated that alternative embodiments may place the proxy elsewhere, such as attached to the support frame for the light redirecting element, such as the underlying support structure of a heliostat. Further, the proxies thus far disclosed have generally been shown mounted parallel to the surface of the light redirecting element, but they may be mounted at any useful angle. Any effective mounting point and angle may be used such that the proxy articulates together with the light redirecting element. In fact, since the sensing camera is generally offset from the target, some amount of static tilt in the proxy is often preferred. This may be provided by mounting the proxy at a tilt, or by adding angle to a Fresnel-ized proxy's individual facets, or by any effective technique.

In some embodiments, the proxy need not even be rigidly attached to the light redirecting element or its support framework. The invention teaches that the proxy may be attached using any effective attachment or mechanism, as long as the angle of the proxy maintains a deterministic relationship with the angle of the light redirecting element, so that a sensing and control system sensing the angle of the proxy may readily compute the angle of the redirected light beam.

Figure 17:
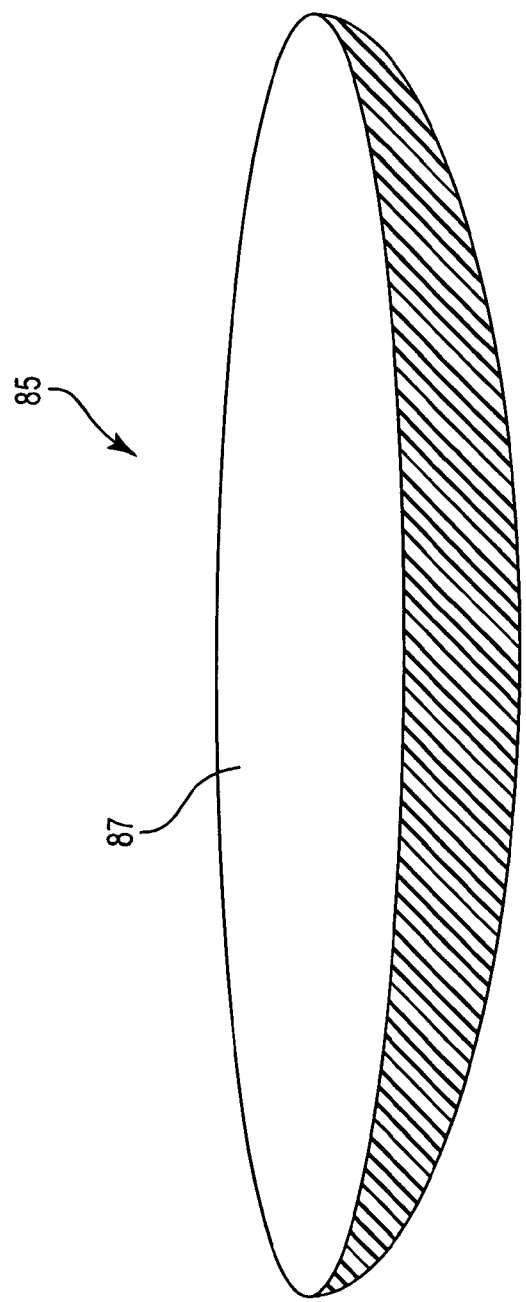
FIG. 17 shows a concave parabolic positional optical proxy. The vertical dimension of the optical proxy is exaggerated for clarity.

It is further contemplated that alternative embodiments of a positional optical proxy need not include Fresnel-ized surfaces. For example, FIG. 17 shows a parabolic mirror proxy 85, with a surface 87 whose slope at every point substantially matches the slope of faceted optical proxy 81. Proxies 81 and 85 will exhibit substantially similar performance. In many embodiments, however, the flat profile of proxy 81 is preferred to the three-dimensional shape of proxy 85, since in many embodiments, the proxy can be desirably integrated with a substantially flat mirror.

Figure 18:
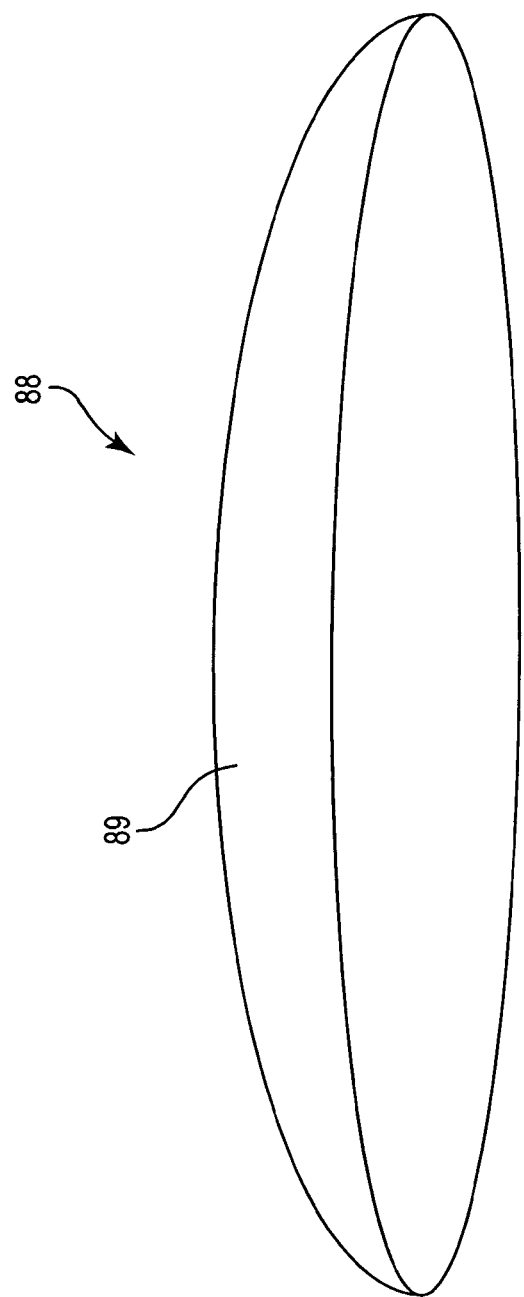
FIG. 18 shows a convex positional optical proxy. The vertical dimension of the optical proxy is exaggerated for clarity.
Figure 19:
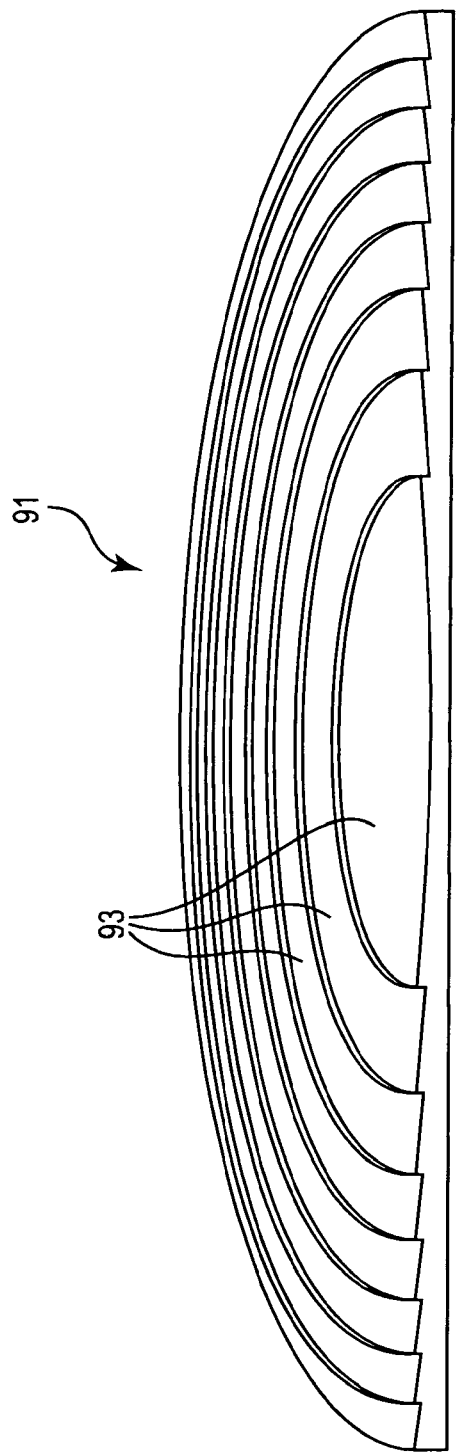
FIG. 19 is a section view of a Fresnel-ized version of a convex positional optical proxy. The vertical dimension of the optical proxy is exaggerated slightly for clarity.

While proxies 81 and 85 illustrate a concave mirror shape, a convex shape is equally useful, performing equivalently to a concave shape, but with opposite sign. FIG. 18 illustrates a convex dome mirror optical proxy 88 with parabolic surface 89, while FIG. 19 illustrates a Fresnel-ized version of a convex dome mirror optical proxy 91 with facets 93 implementing the equivalent of surface 89. Again, a generally parabolic shape may be preferred for linearity, but any effective shape will do.

Embodiments presented above comprise a generally monotonically increasing surface angle with distance from the center, which leads to a generally monotonic encoding of reflected chief ray angle as position of the reflected proxy beam. However, while monotonic encodings tend to be preferred, any effective function may be used. All that is required is that the mapping of a chief reflected ray angle to a proxy spot position be deterministic.

It is also contemplated that other embodiments for a positional proxy device may encode a reflected chief ray angle as multiple light spots, each with its own position as a function of the reflected chief ray angle. Further embodiments may provide reflections of different shapes other than simple spots.

Nonlinear encodings of angles are preferred in many cases. By way of example, in FIG. 14, sensing camera 65 can be placed within a few degrees of the target 63, so an optical proxy is generally used over a range of just a few degrees. By way of example, the angle may be less than 10 degrees, or even less than 5 degrees.

Preferred embodiments, then, may choose to encode fewer than 5 or 10 degrees of angle, helping to provide higher resolution over those limited ranges. However, such an optical proxy may be of limited utility when the light redirecting element is significantly mispointed.

Some embodiments of the present invention may also provide an auxiliary low-accuracy pointing capability over wide angles, to complement a high-accuracy pointing capability over narrow angles. For example, some preferred embodiments can use a low-accuracy open-loop pointing system to point the light redirecting element to within 5 or 10 degrees of the desired target vector, at which point an optical proxy can begin to provide a useful signal for higher resolution, closed loop control.

In other embodiments, an optical proxy can desirably encode a larger range of angles, for example, as many as ±45 degrees, or even ±90 degrees. However, it is appreciated that when normal operations are within 5 to 10 degrees of center, it may not be necessary to provide for particularly accurate angle encoding for larger angles. In this regard, it is contemplated that higher resolution of control can be done for fine adjustment within a limited critical range while a lower resolution control can be utilized for gross adjustment.

Figure 20:
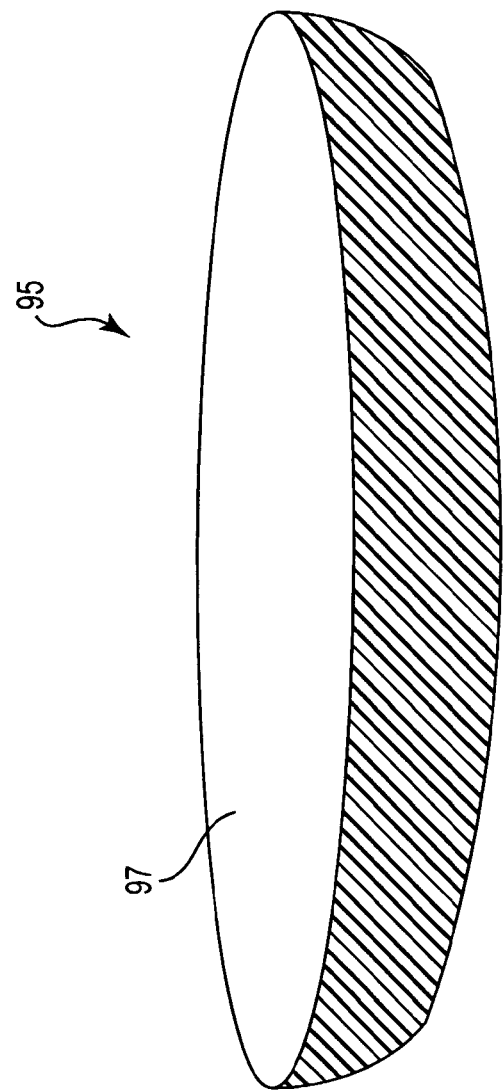
FIG. 20 is a concave positional optical proxy with non-linear encoding of position as a function of angle. The vertical dimension of the optical proxy is exaggerated for clarity.
Figure 21:
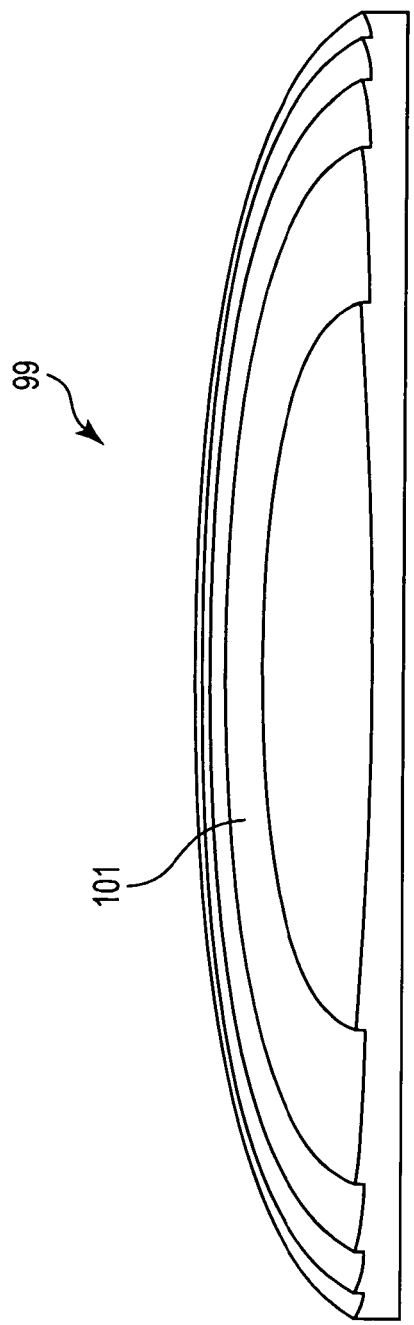
FIG. 21 is a section view of a Fresnel-ized version of a concave positional optical proxy with non-linear encoding of position as a function of angle. The vertical dimension of the optical proxy is exaggerated slightly for clarity.

Some preferred embodiments, therefore, provide a non-linear encoding of position vs. reflected chief ray angle. FIG. 20 illustrates an optical proxy 95 with a reflective surface 97 that is a relatively gently sloped parabola in its interior, but whose slope increases rapidly towards the periphery. This helps to provide an optical proxy whose encoding is of greater sensitivity near the center, but less sensitive closer to the edges of the field. This provides a large active range. FIG. 21 shows an optical proxy 99 with a Fresnel-ized version 101 of the same reflective surface 97. Either concave or convex surfaces may be used, and monotonic or non-monotonic encodings as well.

Embodiments described and suggested thus far have been nominally symmetric. However, asymmetric proxies may be preferred in many cases. For example, when the sensing camera 65 is mounted below target 63 as shown in FIGS. 13 and 14, the chief reflected ray 67 will generally be offset vertically from the proxy beam from a positional proxy device during tracking operations. Thus, preferred embodiments may provide an asymmetric encoding of position vs. angle. By way of example, if camera 65 is nominally 5 degrees below target 63, an associated optical proxy might choose to provide high-resolution encoding over a vertical angular range of −2 degrees to +12 degrees, thus providing a high-resolution region that is symmetric (by ±7 degrees) over the range of typical operation, while providing for a non-linear less precise encoding outside of that typical region.

Other positional proxy devices may vary the resolution of the encoding continuously rather than stepwise, providing increasing resolution in regions closer to the expected operating point. Other embodiments with any other desired resolution properties may be used as well. Just as the encoding of proxy spot position vs. reflected ray angle need not be monotonic or linear, the variation in resolution over the operating range need not be monotonic or linear. Likewise, neither the encoding nor the resolution variation need even provide complete coverage of their respective spaces.

In some modes of practice, an optical proxy may be provided as a plurality of distinct components. For example, a proxy element that encodes a region from −12 degrees to +12 degrees could be provided by one component that encodes −12 degrees to 0 degrees, and another that encodes 0 degrees to 12 degrees. In some embodiments, the components may provide overlapping ranges. For example, a proxy element could be provided with one component that encodes −12 degrees to +2 degrees, and another that encodes −1 degrees to 12 degrees.

One particularly useful application of this principle is in providing proxies with symmetric responses. That is, a proxy that encodes −12 degrees to +12 degrees can be comprised of two identical components which each encode 0 to 12 degrees. By placing the components in opposite orientations, one can encode 0 to 12 degrees, while the other encodes −12 degrees to 0 degrees. Likewise, proxies that encode low and high resolution ranges can be split into low and high resolution components. This invention teaches that any convenient deconstruction into components may be used.

Substantially circular Fresnel-ized structures are but one approach to producing a substantially flat optical proxy according to the present invention. Any sort of faceted surface may be used that produces a desired mapping of reflected ray angle to proxy spot position.

Figure 22:
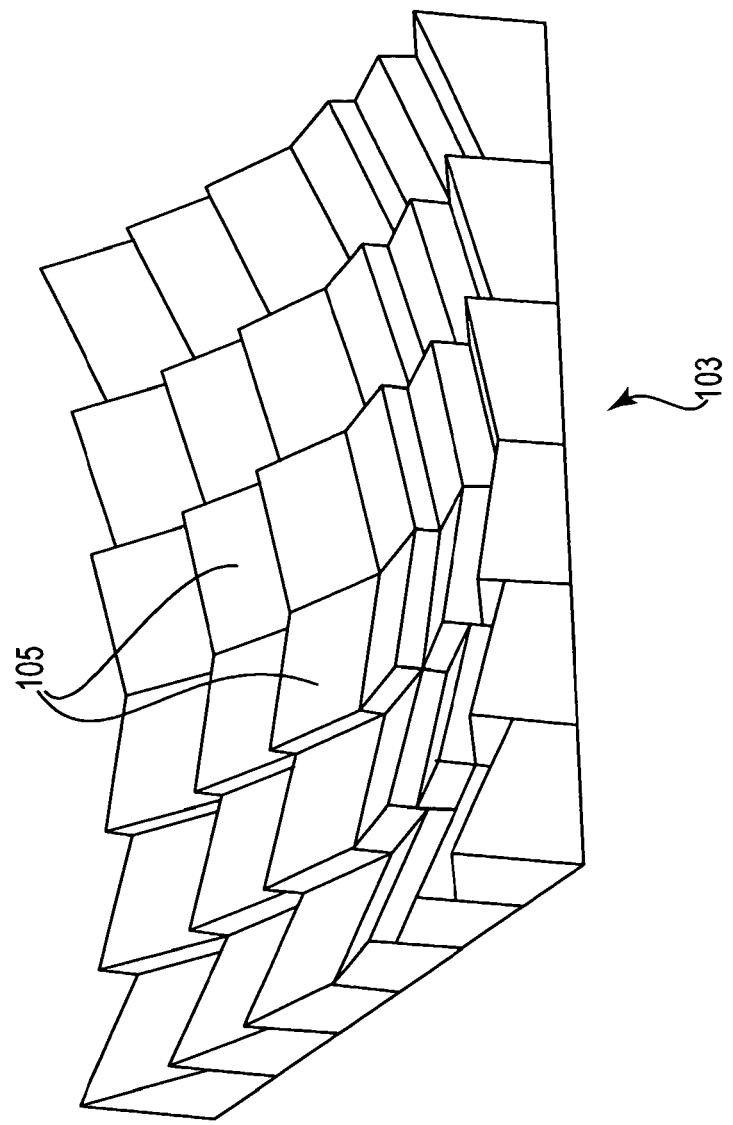
FIG. 22 is a positional optical proxy with facets in a grid-like layout. The vertical dimension of the optical proxy is exaggerated slightly for clarity.

By way of example, whereas the surfaces described and suggested above have been organized according to a radial layout, other embodiments may use a more grid-like arrangement of facets. An optical proxy 103 with a grid-like layout is shown in FIG. 22. The optical proxy 103 in FIG. 22 comprises rectangular facets 105 that provide a surface that has a substantially similar function to optical proxy 81 in FIGS. 13-16. It is understood that what is important is the slope of a surface as a function of position, and that, aside from the momentary discontinuities introduced by a Fresnelizing process, the surfaces of optical proxies 81 and 103 are substantially identical.

In the embodiments described above, facets have generally been described as segments of a curved surface, such a paraboloid. That is, although the segments may appear approximately flat, they each implement a small amount of curvature as appropriate for the region of the curve that they implement.

However, other preferred embodiments may implement segments that are actually flat. The present invention appreciates that, when used with systems that redirect the sun, the required precision of an optical proxy is some fraction of the sun's angular diameter. By way of example, if the sun's diameter is 0.55 degrees, a useful accuracy for the optical proxy may be in a range of 0.01 degrees to 0.1 degrees. With this desired level of accuracy, it may be acceptable to quantize the slopes of the facets of the optical proxy to a corresponding level. Therefore, some optical proxies may provide a series of flat facets, wherein each facet's slope matches the ideal slope to within the desired accuracy, such as within 0.01 degrees.

Figure 23:
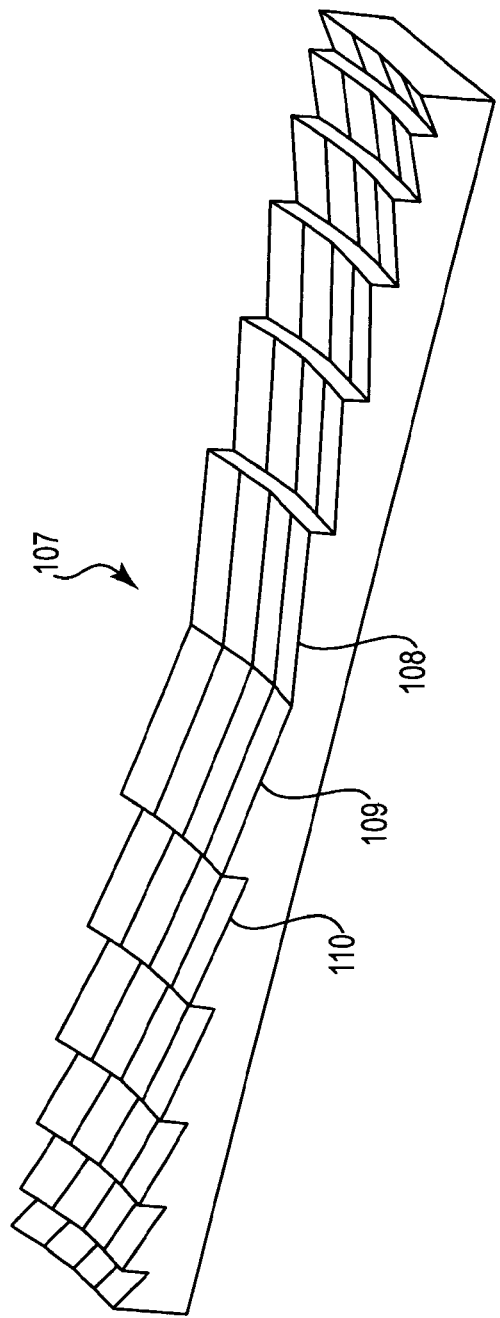
FIG. 23 is a positional optical proxy with flat facets. The vertical dimension of the optical proxy is exaggerated slightly for clarity.

Such an embodiment is shown in FIG. 23, which illustrates optical proxy 107 with flat facets 108, 109, 110, and so on. In the interior of the proxy, where the surface angle is nearly flat, the facets can be larger than in the periphery, since the difference in slope between a flat facet and a curved facet is smaller per area in the interior.

The embodiments presented so far have been substantially two-dimensional, for encoding pointing offset with equal precision in both tip and tilt. Other preferred embodiments may be significantly asymmetric, providing, for example, higher resolution and/or a broad range in one direction, while providing lower resolution and/or a narrower range in the other direction.

Further embodiments may have a structure that is entirely one-dimensional in some instances; while such a one-dimensional embodiment tends to result in a limited optical proxy, it may be able to function as an optical proxy when used with a sufficiently broad light source. For example, if the light source is a spotlight with a 10-degree cone angle, then a one-dimensional optical proxy according to the present invention will broadcast light broadly into at least a 10-degree cone. Thus, with a sufficiently broad light source, one-dimensional structures may nonetheless be suitable for use as a positional optical proxy.

Figure 24:
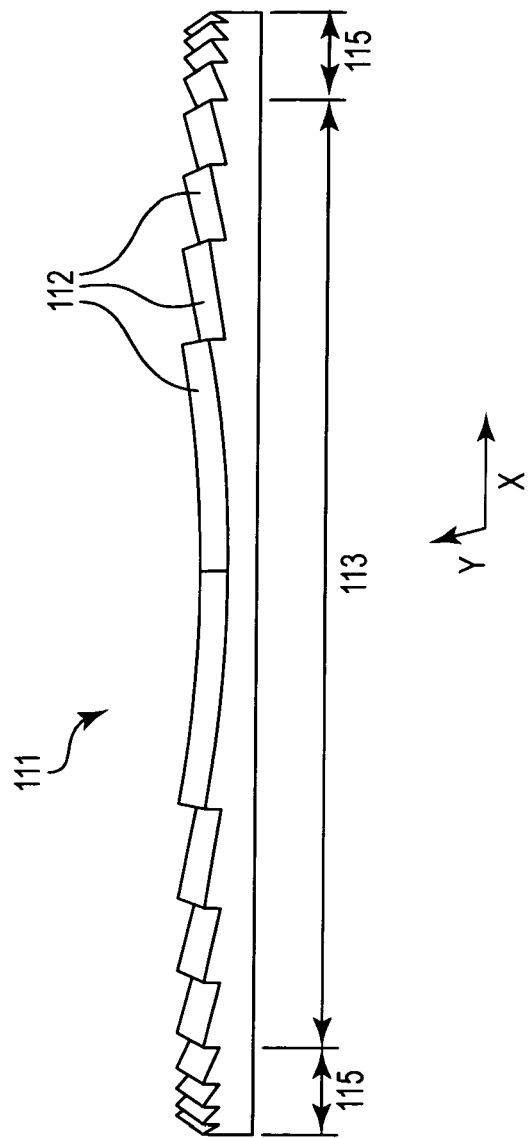
FIG. 24 is a completely one-dimensional optical proxy structure. The vertical dimension of the optical proxy is exaggerated slightly for clarity.

FIG. 24 illustrates a one-dimensional optical proxy structure 111 according to the present invention. It has facets 112 implementing an approximately parabolic shape in its inner region 113, with the slope increasing non-linearly in its peripheral region 115. The proxy as shown has a linear region of ±5 degrees, and an overall operating range of ±20 degrees.

When used with an auxiliary pointing system with good precision, such a proxy may have utility for sun tracking. For example, with a solar disk diameter of 0.55 degrees, the proxy will cast light over a 0.55 degree angle in its non-encoding direction, labeled as "y" in FIG. 24. When used with the sun, the proxy of FIG. 24 would therefore have an active range of 40°×0.55°, which may be sufficient if the auxiliary pointing system is accurate to 0.25 degrees or so. That is, the degree to which a useful optical proxy should cast light "broadly" into three dimensions is related to factors including the precision of any auxiliary pointing system present and to the angular size of the light source that is being redirected. In the case where the auxiliary pointing system has precision that is tighter than the angular size of the light source, proxies with one-dimensional structure may be sufficient.

Figure 25:
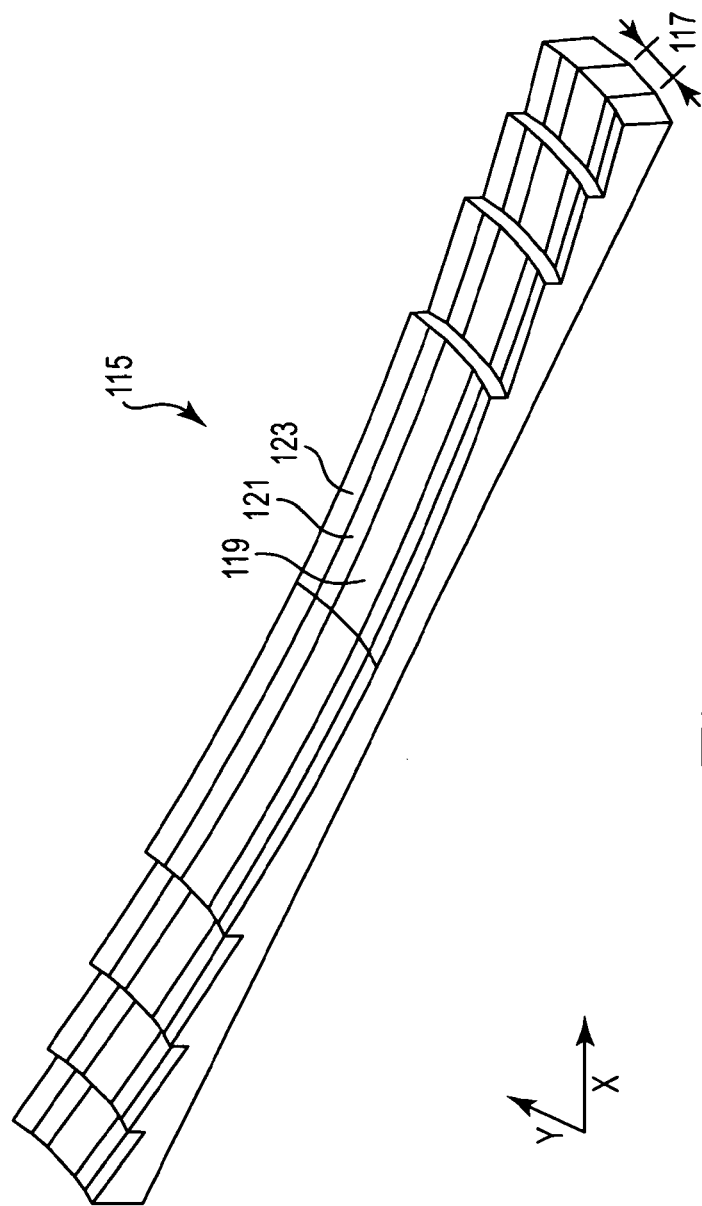
FIG. 25 shows an optical proxy with an asymmetric range of operation. The vertical dimension of the optical proxy is exaggerated slightly for clarity.

In most cases, however, it is desirable to broaden the active range of the proxy by incorporating two-dimensional structures. By way of example, FIG. 25 shows an optical proxy 115 with a range of 40×3 degrees, implementing a substantially one-dimensional swath of a parabolic surface in the x direction in its interior region 117, while also providing ±1.5 degrees of range in the non-encoded y direction by providing curvature in the y direction, as illustrated by the increasing angle of facets 119, 121, and 123.

Note that, in cases where the optical proxy is reflective in nature, the actual surface profile comprises half the angle of the active reflected beam region. By way of example, the ±1.5 degrees of active region in the non-encoding direction will tend to comprise surface angles of ±0.75 degrees in that direction.

Just as in the long, encoding direction, the narrow, non-encoding direction may be non-linear, with the bulk of the proxy area being devoted to angles near the nominal operating angle, but with a smaller area nonetheless devoted to a wider range of angles. The proxy signal from these wider angles will tend to be weaker, but this tends to be acceptable since precision is often not required far from the nominal operating point.

Figure 26:
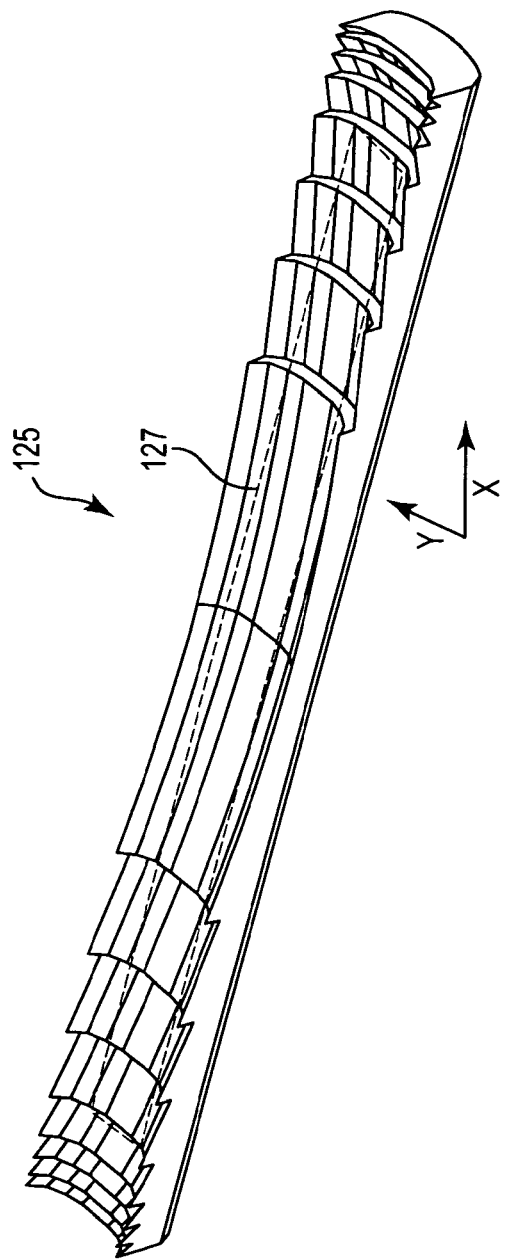
FIG. 26 shows an optical proxy with both linear and non-linear regions. The vertical dimension of the optical proxy is exaggerated slightly for clarity.

Another preferred optical proxy according to this principle is shown in FIG. 26. FIG. 26 shows optical proxy 125 with a linear active region (denoted by the area inside outline 127) of 20×3 degrees and a non-linear active region extending to cover 40×40 degrees, with the encoding in the active x direction being more precise (and thus physically greater in extent) than the encoding in the inactive y direction.

Figure 27:
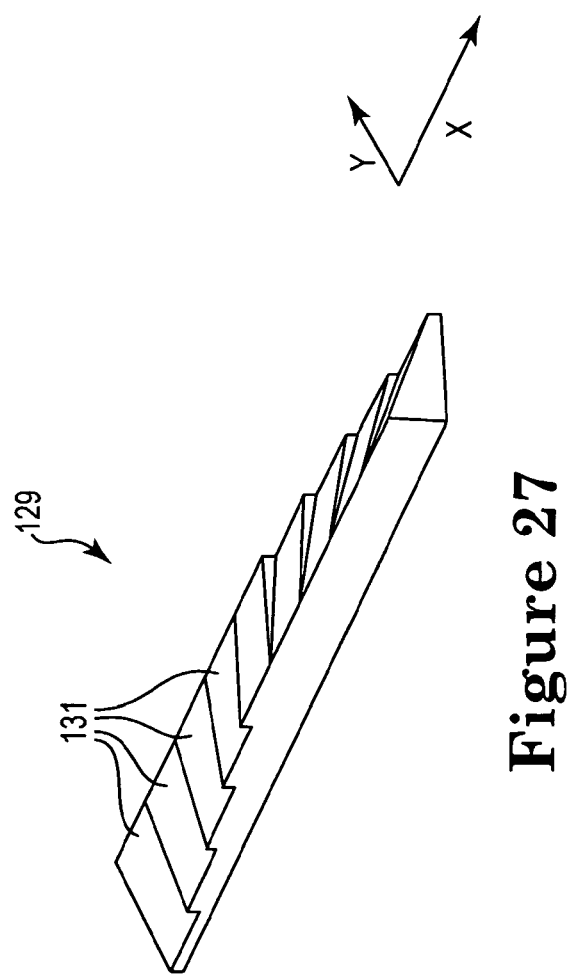
FIG. 27 shows an optical proxy using twist to encode tilts in the y direction. The vertical dimension of the optical proxy is exaggerated slightly for clarity.
Figure 28:
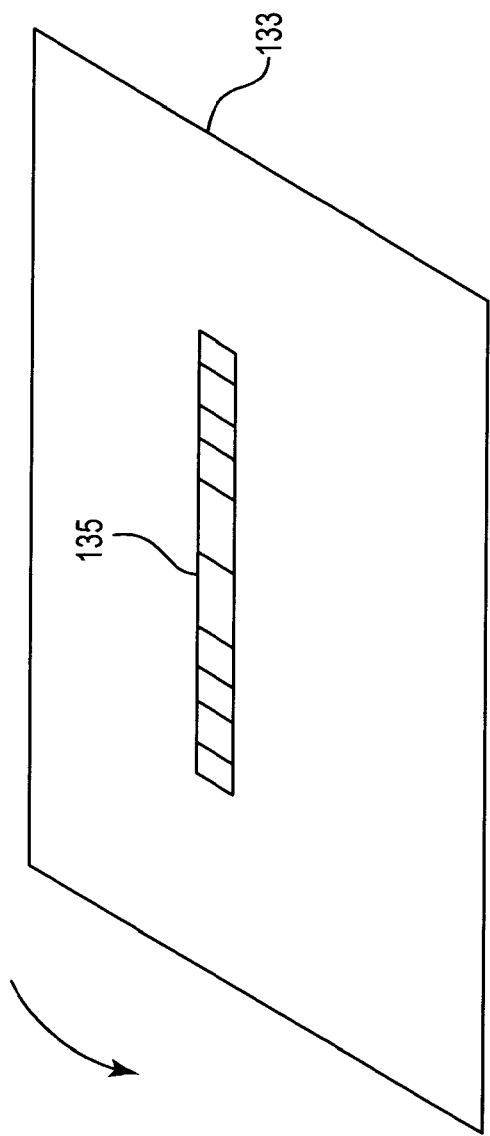
FIG. 28 shows an optical proxy on a heliostat that is tilted downward.
Figure 29:
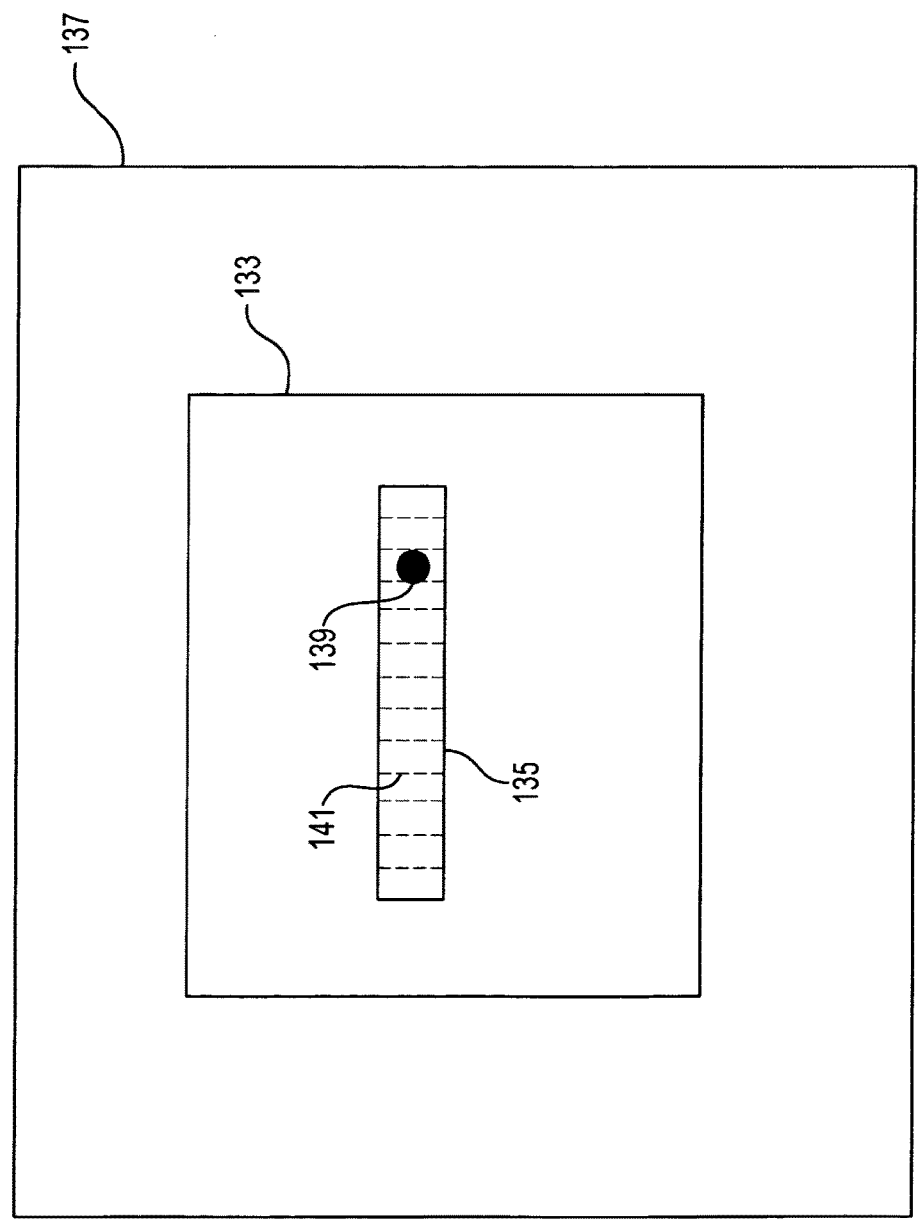
FIG. 29 shows a portion of the image seen by the sensing camera viewing the scene of FIG. 28.
Figure 30:
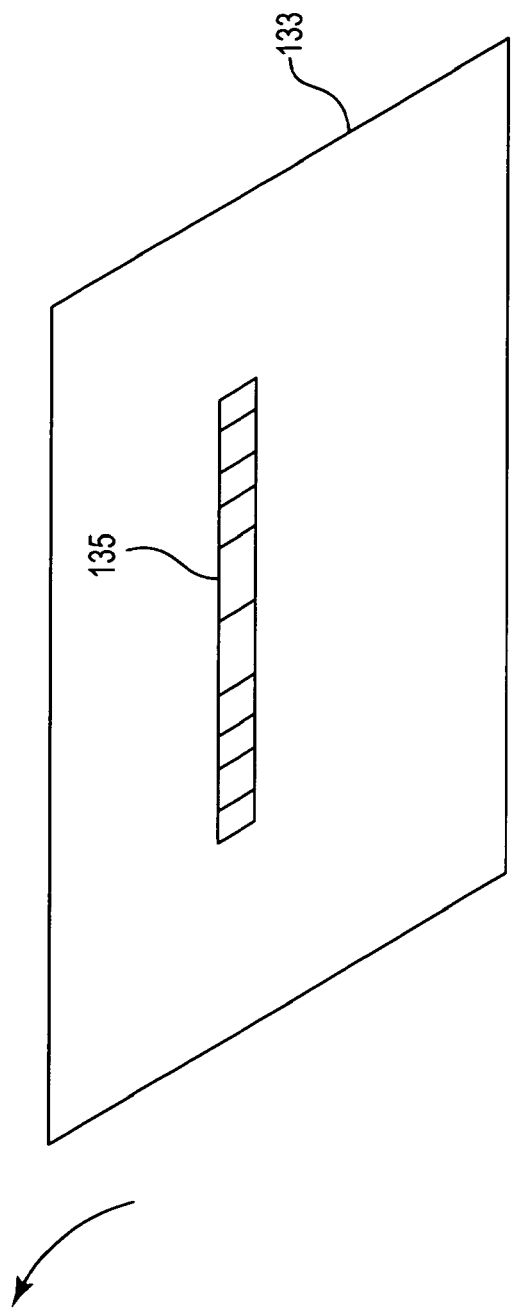
FIG. 30 shows an optical proxy on a heliostat that is tilted upward.
Figure 31:
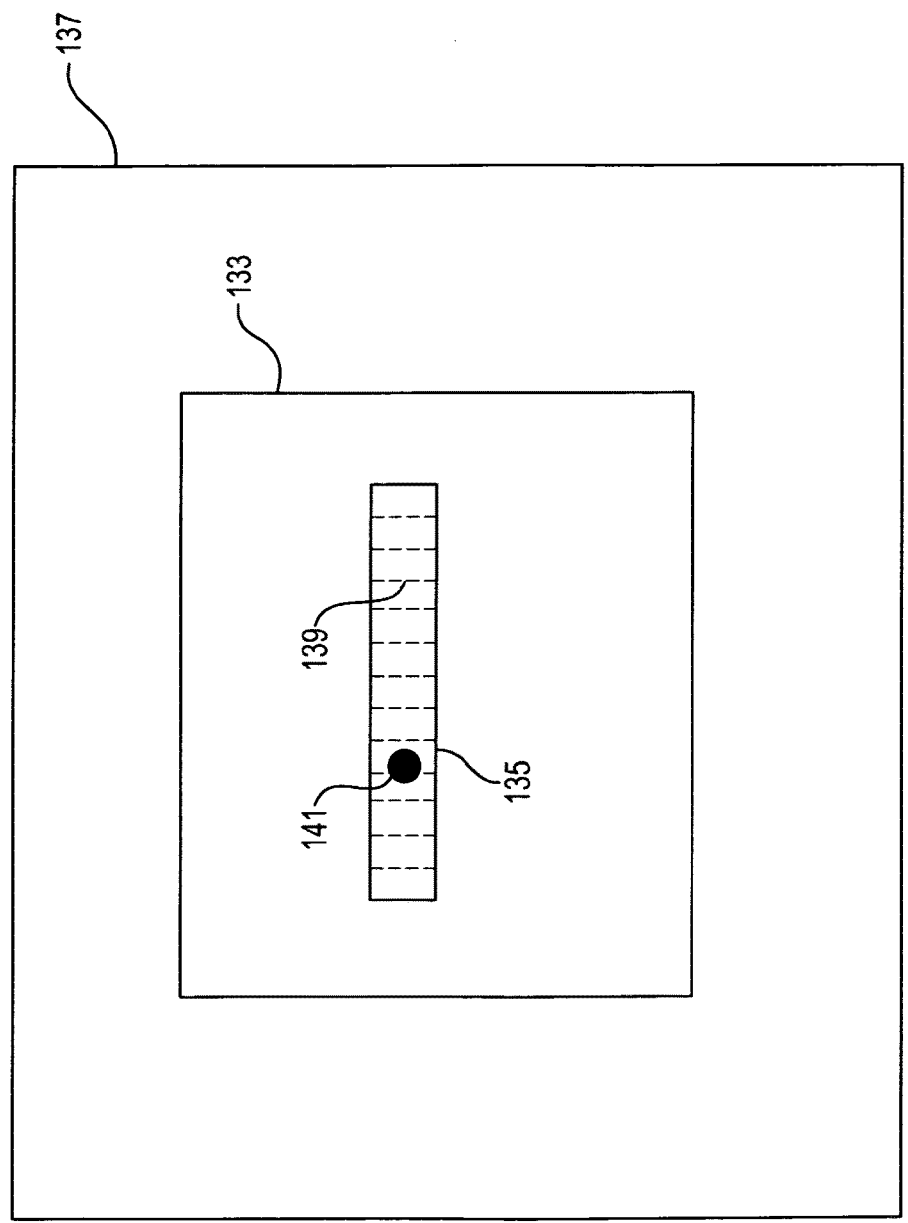
FIG. 31 shows a portion of the image seen by the sensing camera viewing the scene of FIG. 30.

Further embodiments of substantially one-dimensional optical proxy structures are possible in addition to the proxy of FIG. 24. Whereas FIG. 24 encodes angle vs. position by Fresnel-izing a "bowl" shape, FIG. 27 illustrates an optical proxy 129 with an encoding 131 that Fresnel-izes a "twist" shape. Whereas the bowl shape encodes an angle in the proxy's long x direction, a twist shape encodes the orthogonal y direction. This is shown in FIGS. 28-31. FIG. 28 shows a twist-type optical proxy 135 attached horizontally to light redirecting element 133, which is oriented in a first, more downward-looking direction, as indicated by the curved arrow. This leads to the rectangular image region 137 as seen by camera sensor 65, shown in FIG. 29, with proxy 135 showing a bright spot at position 139. FIG. 30 shows the same twist-type proxy 135, with light redirecting element 133 oriented in a second, more upward-looking direction, as indicated by the curved arrow. FIG. 31 shows the corresponding image region 137 as seen by camera sensor 65, with proxy 135 showing that the bright spot has moved to position 141.

Figure 32:
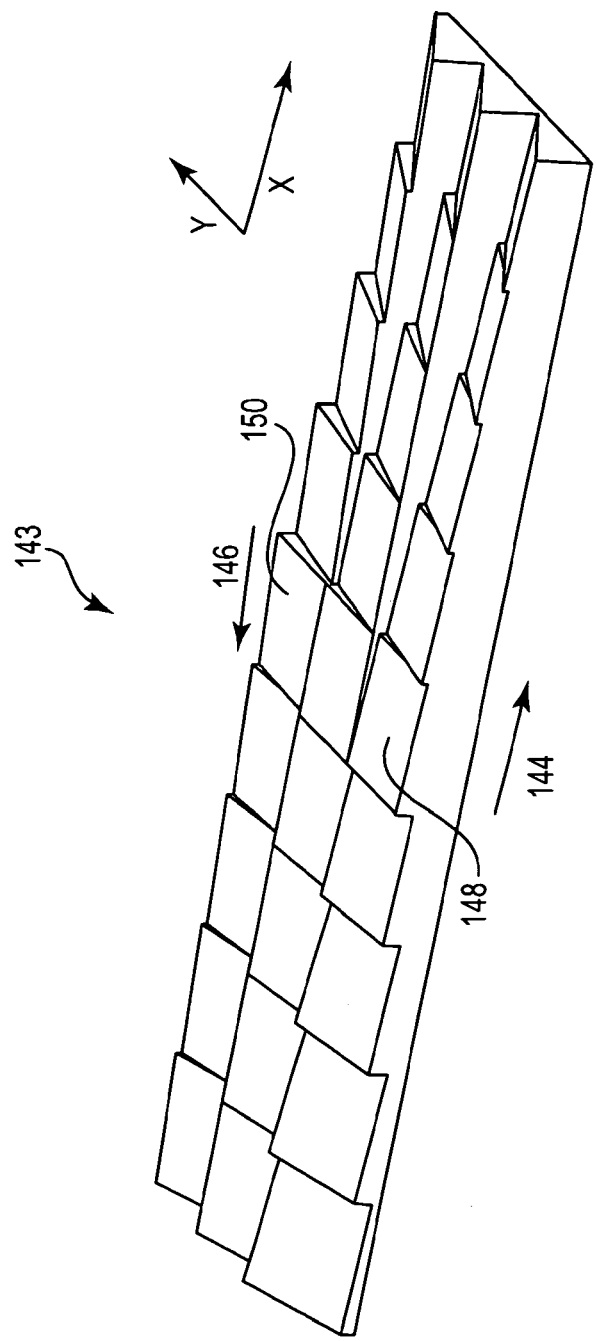
FIG. 32 shows an optical proxy that uses twist to encode angle and that has a wide range of operation in the x direction. The vertical dimension of the optical proxy is exaggerated slightly for clarity.

It is also contemplated to extend the range of such a proxy so that it distributes light broadly into three dimensions, thus creating a non-limited, fully functional optical proxy according to the present invention. One preferred method for this is to provide multiple parallel rows of twisted facets, with a net left-right tilt applied to successive rows, as shown in FIG. 32. FIG. 32 illustrates proxy 143 that uses the twisting technique to create an optical proxy with a 3×40 degree range, twisting as a function of x to provide encoding in the y direction, while tilting the entire strip about y to provide some range in x. The twisting is easily seen in the figure, as the facets rotate as you move from left to right in x. Facets from different rows also have different tilts in the x direction in order to provide an x range. This can be seen by comparing facet 148 in the front row to facet 150 in the back row. While both have identical y tilts, they exhibit different x tilts, as indicated by the non-parallelism of arrows 144 and 146, which are parallel to the edges of facets 148 and 150 respectively.

Generally rectangular optical proxies of the types shown in FIGS. 26 and 32 tend to be preferred over the generally circular optical proxy of the type shown in FIG. 11, because they occupy less area on their host light redirecting element. By using two of the rectangular proxies, each encoding one axis, one can achieve the same functionality as the generally circular proxy, while consuming less area. Preferred embodiments thus provide two or more rectangular proxies.

However, since the "Fresnel bowl" proxy of FIG. 26 and the "twist proxy" of FIG. 32 encode orthogonal directions, they can be placed side by side—either both horizontally or both vertically, or in any effective orientation in order to provide high-precision encoding of two-dimensional angle space, with a wide active region, while together being largely one-dimensional in structure, and thus advantageously occupying relatively little space on the light redirecting element.

Figure 33:
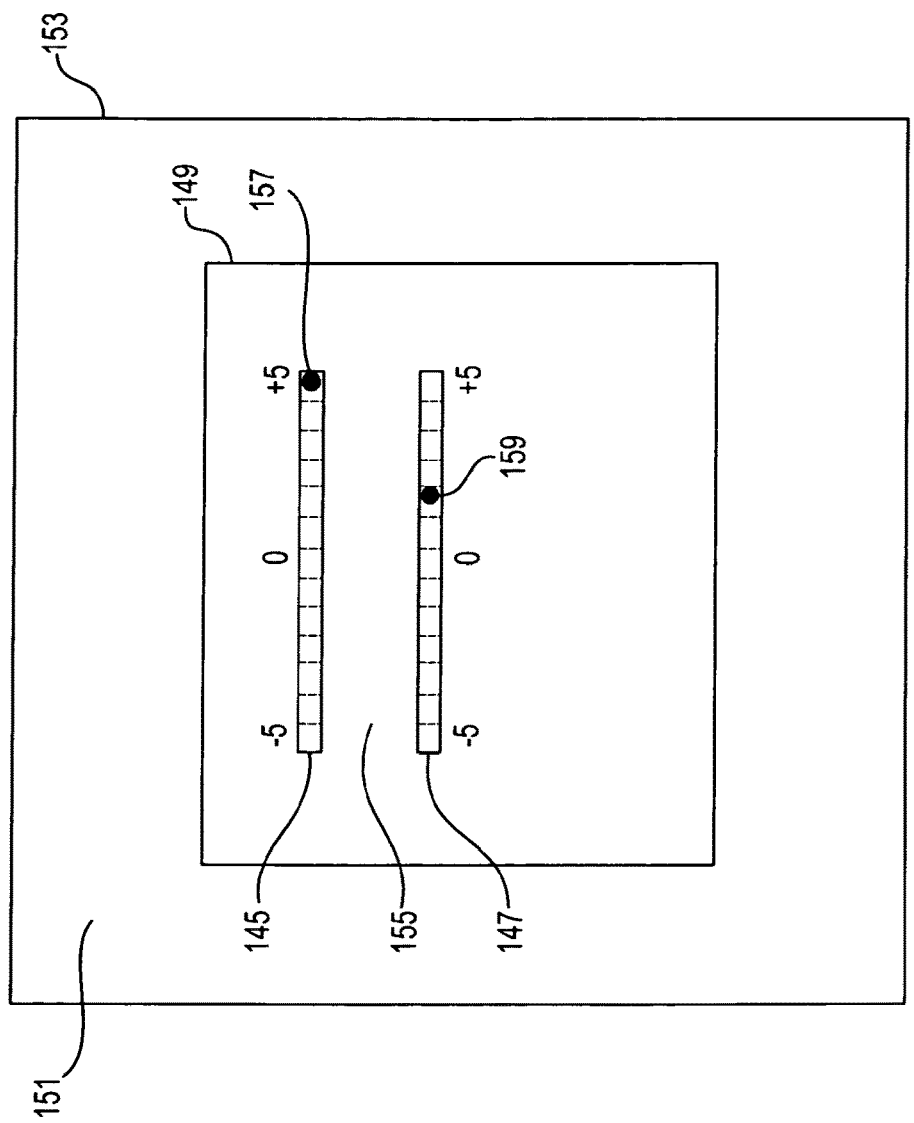
FIG. 33 shows a portion of the image seen by the sensing camera viewing a pair of horizontally oriented optical proxies.

When two proxies are placed close together according to this principle, a sensing camera 65 (see FIG. 14) will ideally have sufficient resolution to be able to clearly distinguish between them. That is, while the proxies themselves may potentially be thinner than a single pixel in their non-encoding direction, they are preferably separated by at least one pixel in order to be able to distinguish between the proxy spots from each of the two proxies. This situation is shown in FIG. 33, which is an image of a horizontally encoding proxy 145 and a vertically encoding proxy 147 placed horizontally on a mirror 149, as viewed by sensing camera 65 with pixel grid 151 in a rectangular image region 153. A gap 155 comprising at least one row of pixels is present. In the figure, the proxies have been labeled with angle indicators to illustrate the encoding of angle as position. As shown, with spots 157 and 159 created by the proxies, it is understood that the chief reflected ray of mirror 149 is at an angle of +5 degrees horizontally and +2 degrees vertically from the camera viewing angle.

A second consideration in the placement of optical proxies is blurring of the image. Blurring can cause the images of proxies that are nominally separated by one or more pixels to nonetheless merge into one another. Blurring may be caused by the optical system associated with the sensing camera (for example, by being out of focus, or by providing a lens with insufficient resolution to resolve individual pixels), by atmospheric turbulence, fog, or other physical phenomena. Many preferred embodiments therefore provide sufficient space between the proxies so that the proxy images, including expected blurring, are separated by at least one pixel.

However, some embodiments may comprise a placement of two proxies even closer together than one pixel. This would lead to a situation where there are two proxy spots coming from what appears to be a single proxy.

Figure 34:
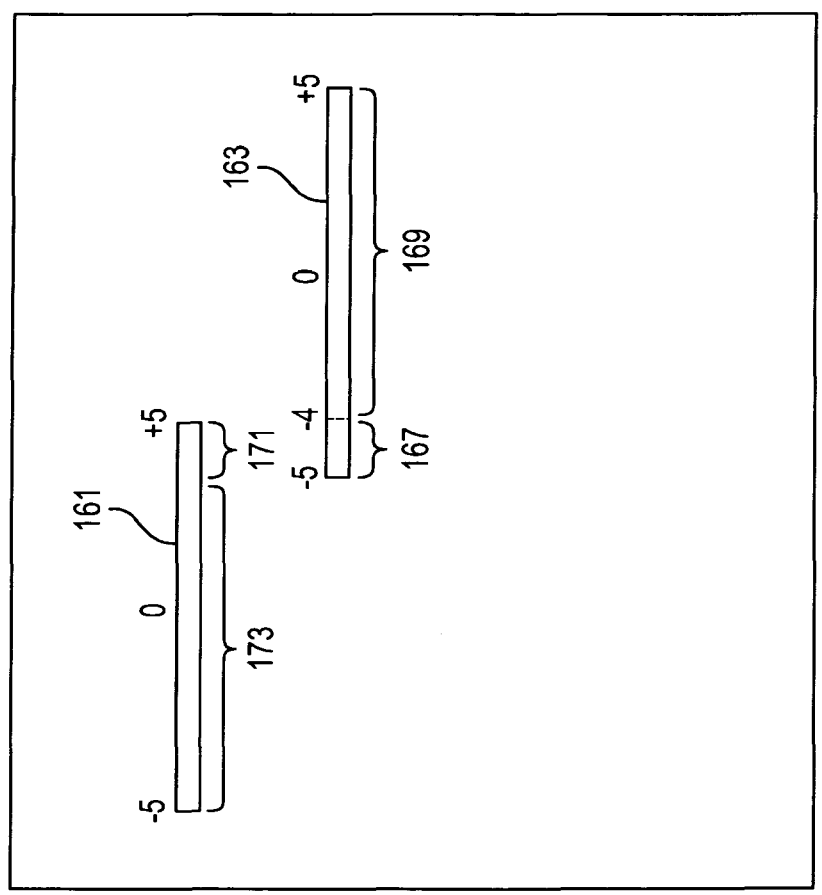
FIG. 34 shows a mirror with a pair of optical proxies whose ranges partially overlap horizontally.

One approach to dealing with this situation is to shift the zero point of one or both of the proxies, so that in the nominal operating condition, the two spots remain distinct. This is shown in FIG. 34. As in FIG. 33, two horizontally oriented optical proxies are provided, with proxy 161 encoding horizontal angle and proxy 163 encoding vertical angle. In this case, though, proxy 163 has been placed at an offset horizontally. In this situation, the two spots may remain well separated at the nominal operating angle—although portion 167 of proxy 163 overlaps horizontally with portion 171 of proxy 161, at the nominal operating condition, the proxy spots are typically expected to be in regions 169 and 173, so they can be distinguished.

Figure 35:
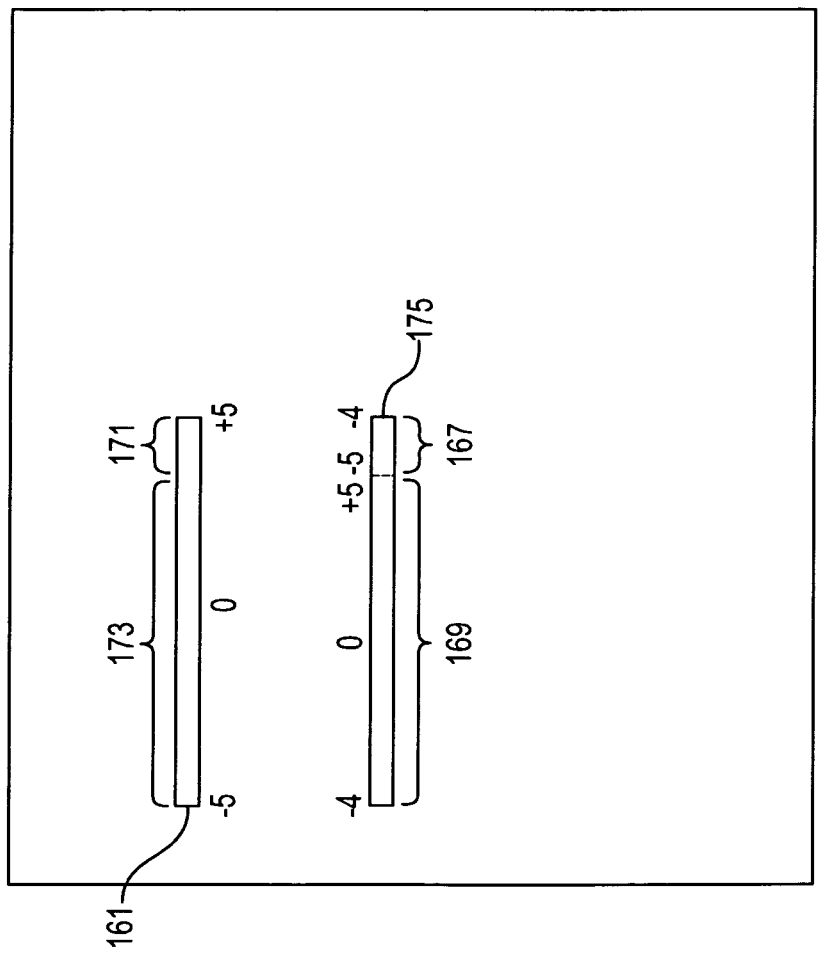
FIG. 35 shows a mirror with a pair of optical proxies whose ranges overlap horizontally, with the active range of one of the proxies offset horizontally with respect to the other.

Further embodiments use the same approach as in FIG. 34, but use proxies that "wrap around" to achieve the offset, rather than providing a physical offset, as shown in FIG. 35. Starting from FIG. 34, proxy portion 169 is separated from the mirror, and in FIG. 35 proxy portion 169 is moved to be directly underneath portion 173 of proxy 161, forming a new proxy 175 comprising the two portions of proxy 163 in a new arrangement. The resulting proxy 175 has a discontinuity in its encoding of angle as position, but this does not present any particular problems.

Figure 36:
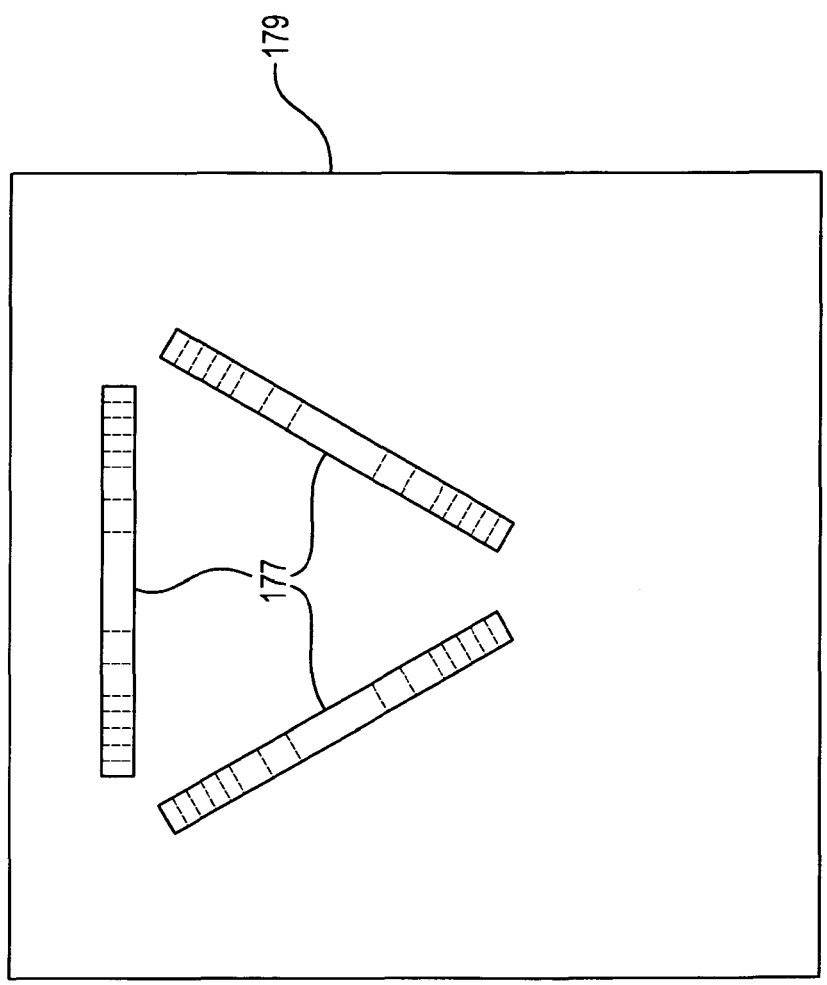
FIG. 36 shows three optical proxies oriented at 120 degrees to each other.

In many other embodiments, multiple sets of optical proxies are provided, and possibly with multiple orientations. By way of example, FIG. 36 illustrates a mirror 179 with three identical proxies 177 that are oriented at 120 degrees from each other. Each encodes its own direction. While two such proxies are generally sufficient to determine the angle of the redirected beam, a third proxy can be used to provide redundant information that can be used to assess the accuracy of the proxy measurement.

Figure 37:
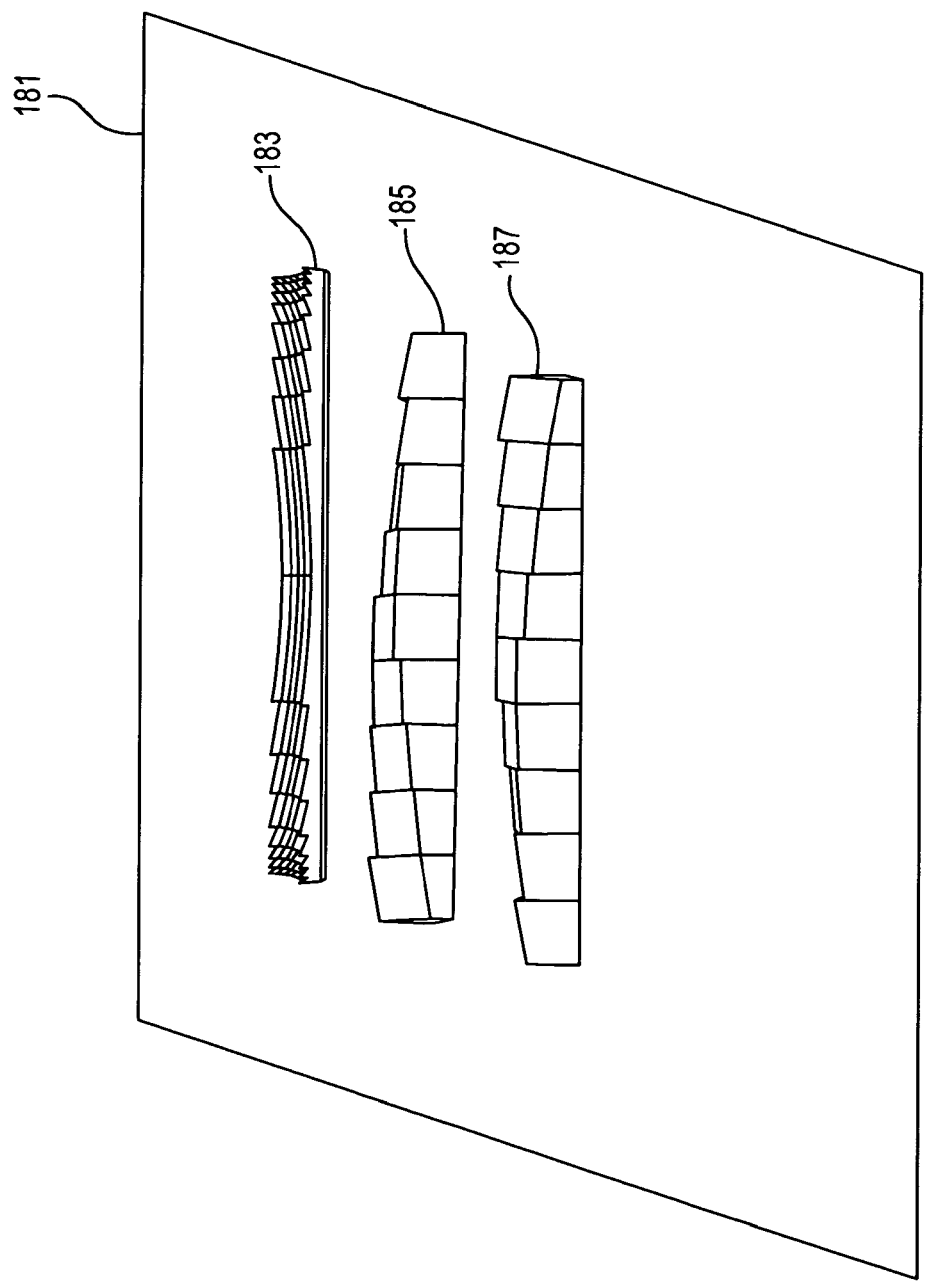
FIG. 37 shows three horizontal optical proxies that encode axes oriented 120 degrees from each other. The vertical dimension of the optical proxies are exaggerated slightly for clarity.

FIG. 37 illustrates a similar situation with a mirror 181 having three horizontally oriented proxies. Proxy 183 encodes the horizontal direction, while proxies 185 and 187 encode directions that are ±120 degrees from that direction. The embodiment in this figure appreciates that contemplated proxies may encode any angles in any convenient direction. While the proxy of FIG. 26 shows a proxy that principally encodes the x axis, and the proxy of FIG. 32 principally encodes the y axis, proxies can be made that encode any convenient combination of the axes, including a combination oriented 120 degrees from horizontal.

Figure 38:
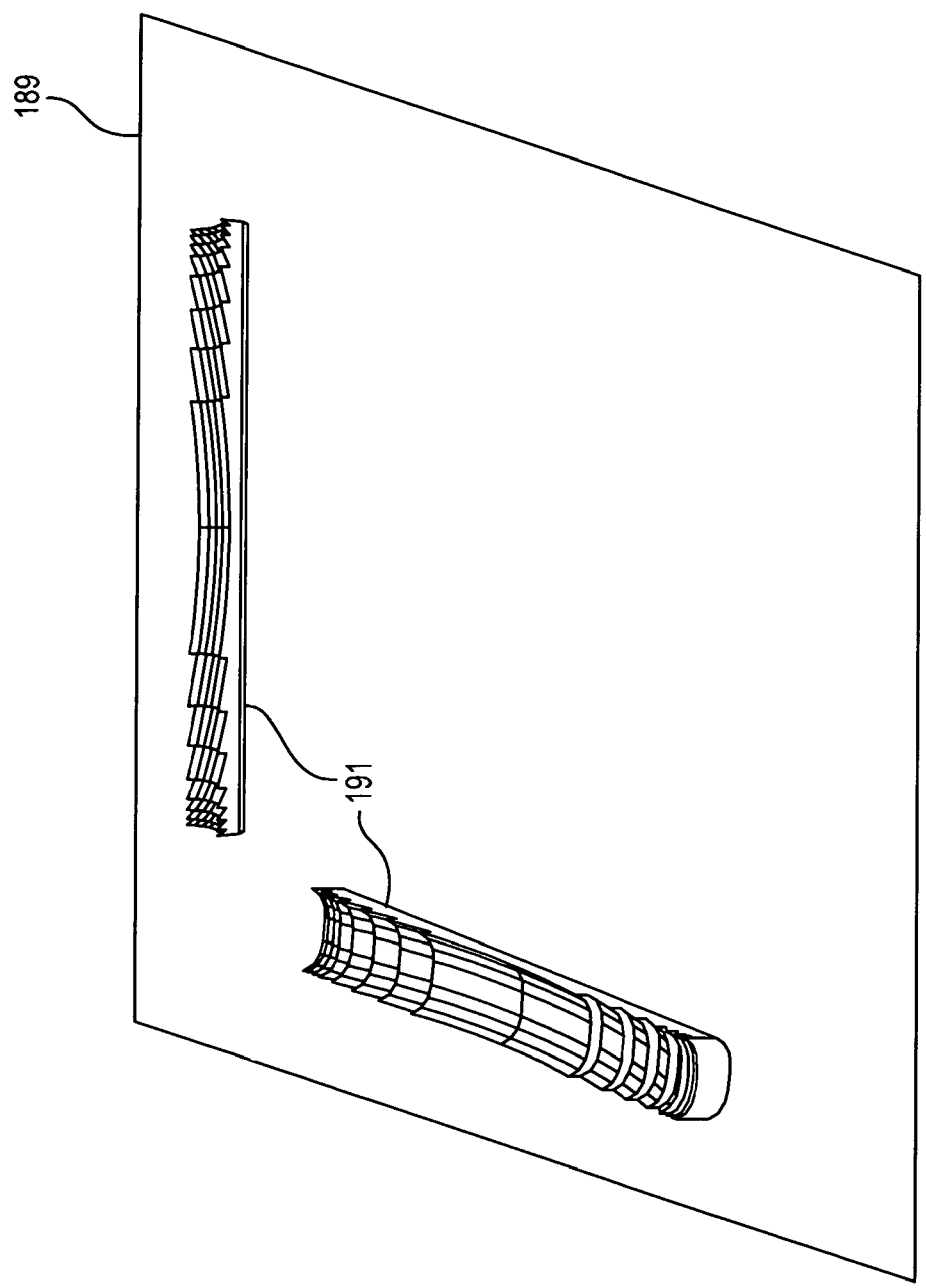
FIG. 38 shows a pair of optical proxies mounted orthogonally to each other.

FIG. 38 illustrates a mirror 189 with two identical proxies 191, one mounted horizontally and one mounted vertically, so that one encodes the horizontal direction and one encodes the vertical direction.

In certain situations with an array of reflectors, mirrors can be occasionally shadowed by other mirrors or by other obstructions at a power plant. In such a situation, it may be preferable to have multiple sets of optical proxies in order to help provide at least one unshaded proxy for most of the day.

Figure 39:
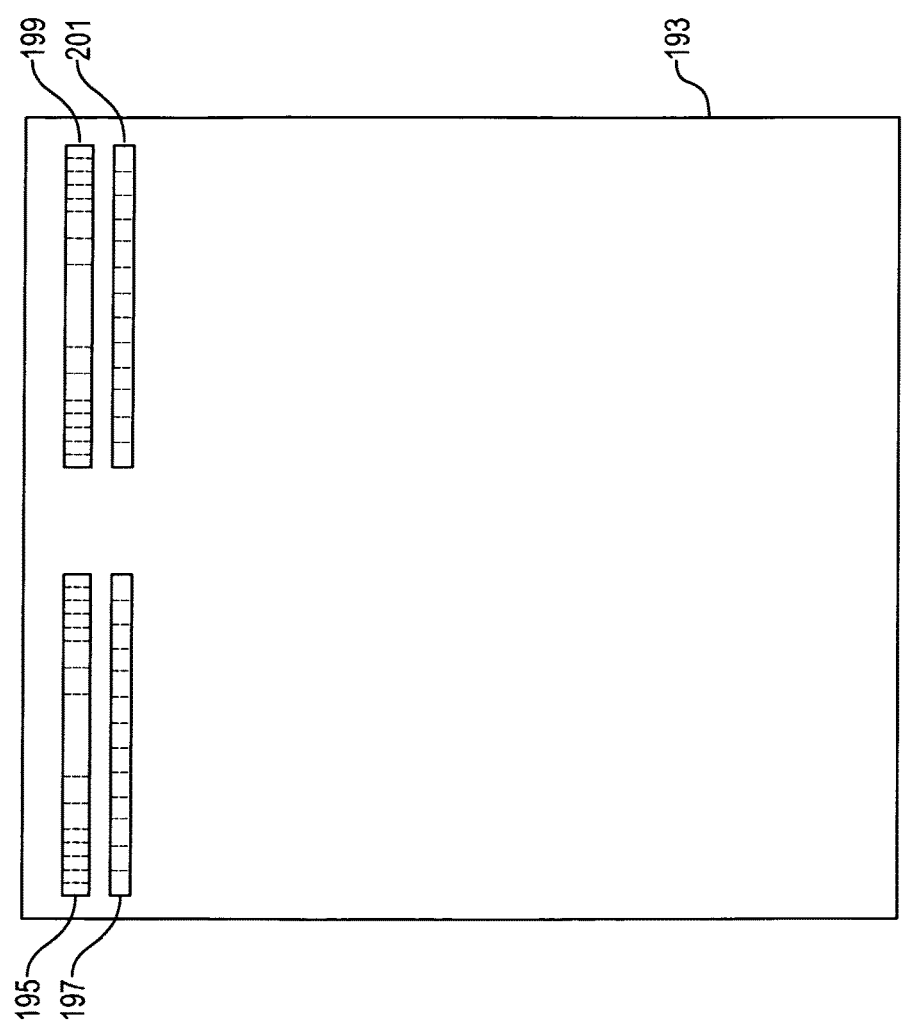
FIG. 39 shows two pairs of optical proxies, mounted horizontally in the upper corners of a mirror.

FIG. 39 illustrates one preferred embodiment of multiple proxies that may be particularly useful in a tip-tilt heliostat field. Since shadows from neighboring mirrors tend to encroach from either the left side or right side, but not both at the same time, and since the top of the mirror tends to have an unobstructed line of sight to the sensing camera 65, one preferred configuration is to provide a pair of horizontally oriented proxies 195 and 197 in the upper left portion of the mirror 193, and another pair 199 and 201 in the upper right portion of the mirror. As shown in the figure proxies 195 and 199 encode horizontal angle, while 197 and 201 encode vertical angle.

Figure 40:
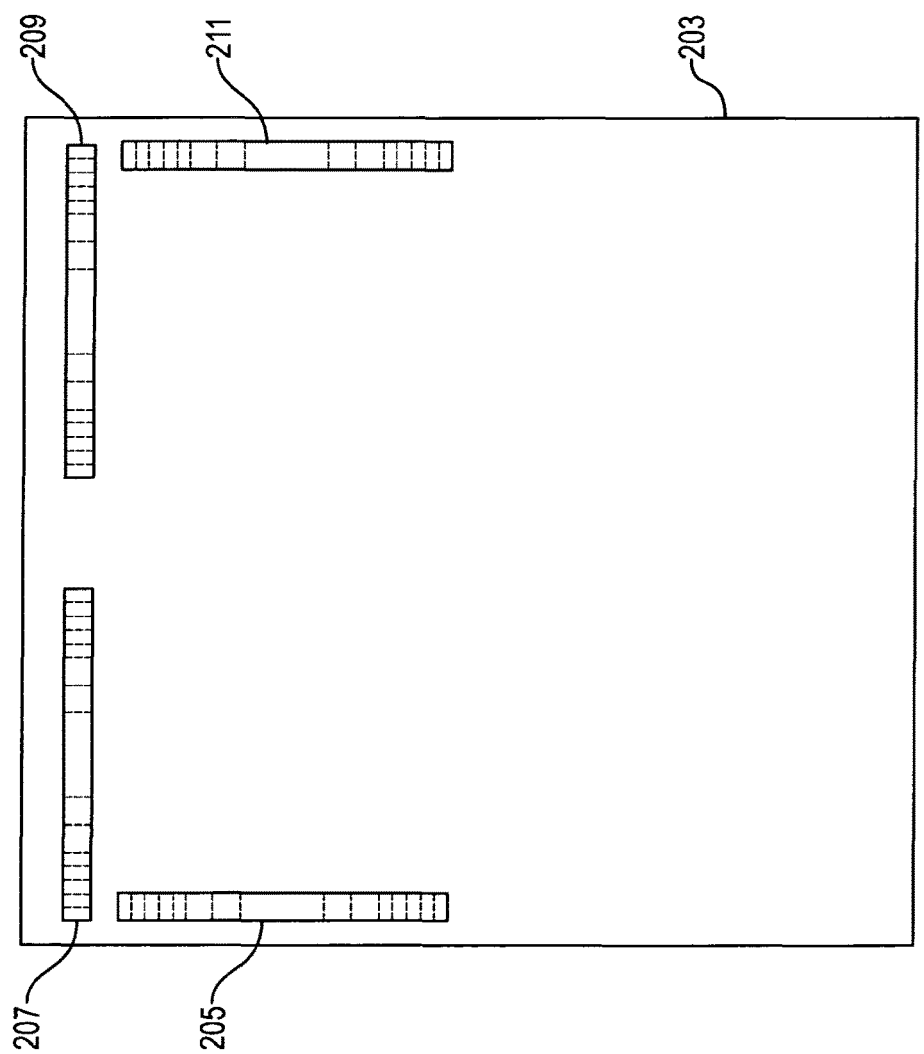
FIG. 40 shows two pairs of optical proxies, mounted orthogonally in the upper corners of a mirror.

FIG. 40 illustrates another preferred embodiment for dealing with shading, with one pair of proxies 205 and 207 on the left side of mirror 203, and another pair 209 and 211 on the right side of the mirror. Proxies 207 and 209 encode the horizontal direction, while proxies 205 and 211 encode the vertical direction.

Optical proxies may be placed on or behind the light redirecting element, or may be attached to a frame supporting the light directing element.

In the case of a reflective proxy, the proxy may provide its own reflective layer, or it may take advantage of the reflective material of the main mirror, by being encapsulated within the mirror coating.

Reflective proxies may be either front or back surface reflectors. Optical proxies suitable for use according to the present invention do not have to exhibit ultra-high reflectivity typically required of solar mirrors themselves, and thus may readily comprise a variety of materials and constructions. For example, lower-efficiency mirrors of the type used in the automotive industry have excellent lifetime properties, at low cost.

In some embodiments, a Fresnel-ized curve can be provided on the front side of the proxy optic, and a reflective coating can be provided also on the front side. This helps to enable the construction of the proxy from materials, such as low-cost plastics, that would otherwise be sensitive to ultraviolet damage.

In other embodiments, a Fresnel-ized curve can be provided on the back side of the proxy optic. Some embodiments can use thin proxies of molded glass. In the case of solar mirrors, these advantageously help to match the coefficient of thermal expansion of the main mirror glass, are tolerant of ultraviolet radiation, and are chemically compatible with the existing mirror manufacturing process, allowing for easy encapsulation within the mirror coating.

In still further embodiments, a Fresnel-ized curve of a proxy can be embossed directly into the front or back surface of the light redirecting element. For solar mirrors, particularly preferred embodiments emboss the proxy shape into the rear of the mirror prior to silvering.

One advantage of preferred proxies according to the current invention is that their encoding of angle into position is largely unaffected by variations of the brightness of the sun, or clouds in the sky, or soiling of the mirror. While these factors may introduce a slight amount of random noise into the measurement, they do not tend to introduce much systematic bias, and a centroiding process used to measure the position of the proxy spot is intrinsically high in precision, with sub-pixel accuracy readily achievable. Centroiding processes themselves are well understood for the purpose of determining an accurate center of a spherical spot, for example, as well as with other shapes. However, a sub-pixel positional reference can also be desirable in order to take full advantage of an accurate centroid measurement.

That is, referring back to FIG. 33, the optical proxies were labeled with angle indicators so as to help correctly illustrate the encoding of position to angle.

Figure 41:
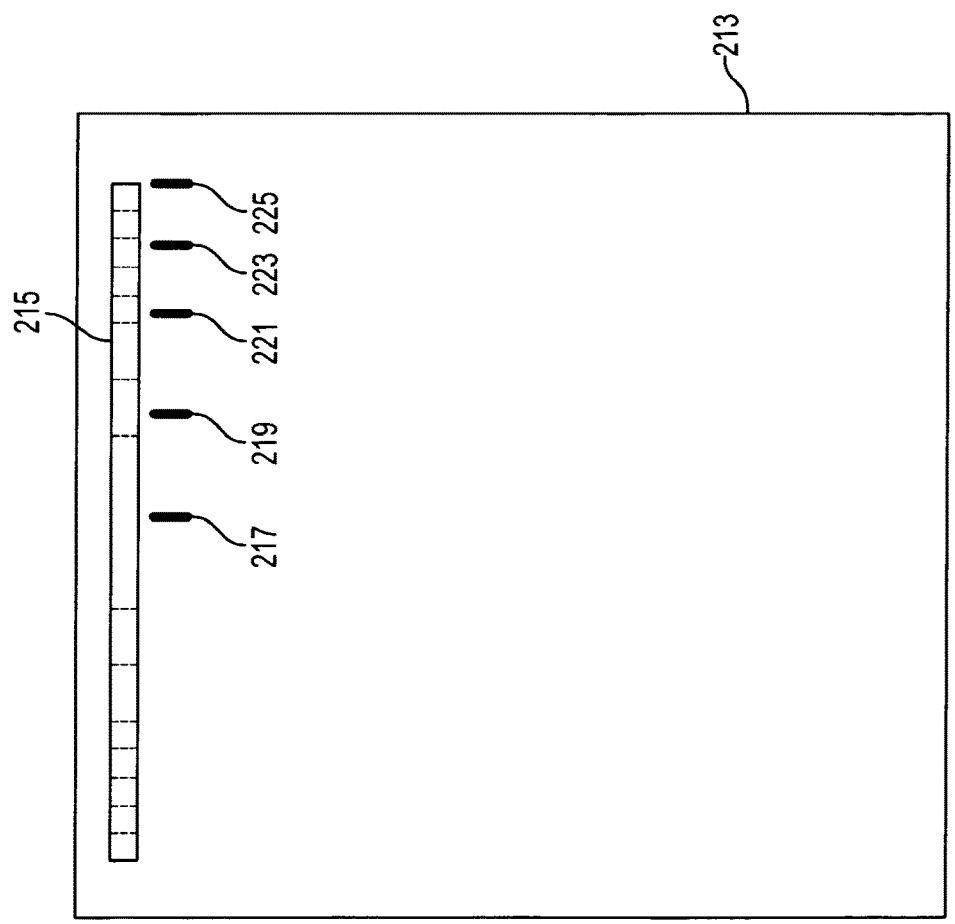
FIG. 41 shows an optical proxy with ruler marks.

In one embodiment, marks can be provided alongside the proxy, just like a ruler, as shown in FIG. 41, with each mark indicating a certain amount of angle. FIG. 41 illustrates a mirror 213 with a proxy 215 with marks next to it. Proxy 215 provides a non-linear encoding of position vs. angle, with mark 217 indicating zero angle, while mark 219 indicates 1 degree, mark 221 indicates 2 degrees, mark 223 indicates 4 degrees, and mark 225 indicates 8 degrees.

In practice, it is likely not necessary to provide so many marks. If the structure of the proxy is known, one only need know the endpoints of the "ruler".

Figure 42:
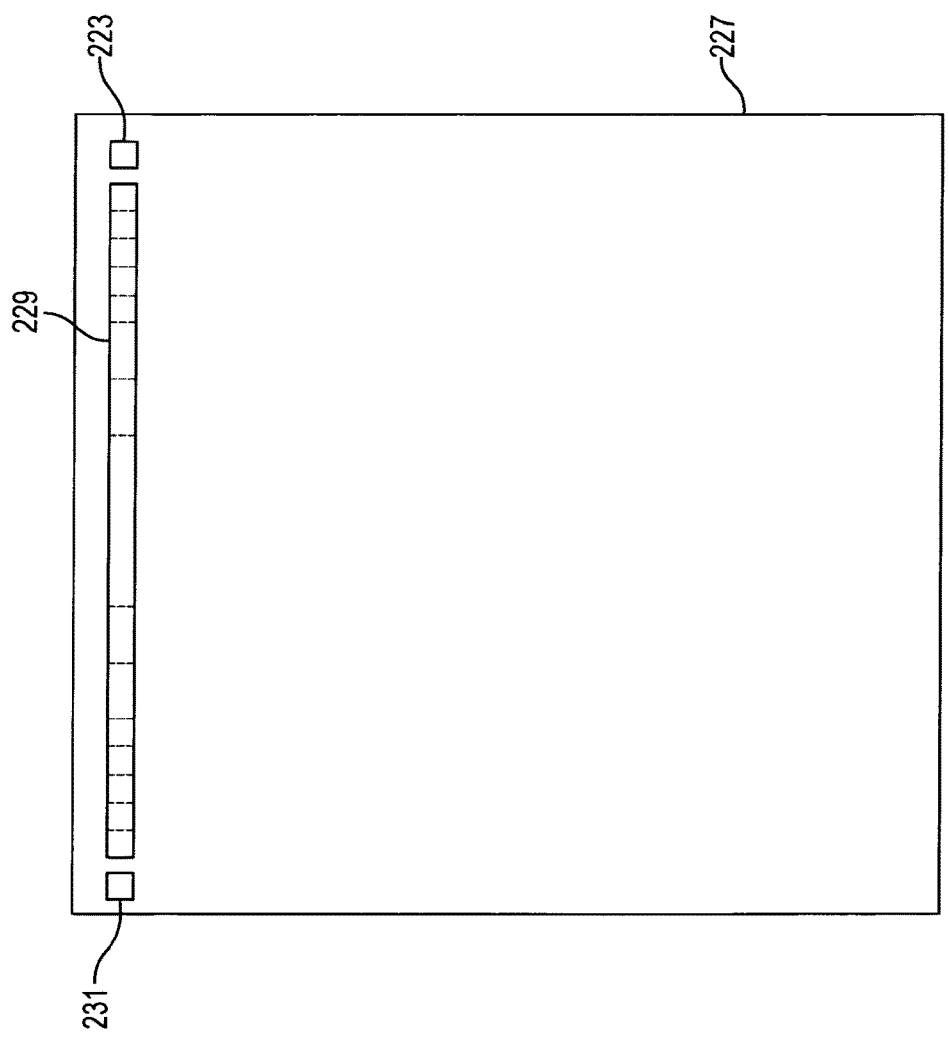
FIG. 42 shows an optical proxy with optical position reference indicators.

One preferred embodiment uses small bright spots to provide reference marks for the optical proxy "ruler", as shown in FIG. 42. Mirror 227 hosts proxy 229 and indicators 231 and 233. Indicators 231 and 233 provide symmetric positional references for proxy 229—the center of proxy 229 is nominally placed halfway between them.

In some embodiments, the positional reference indicators may be actual light sources, like LED's. In preferred embodiments, positional references can be small narrow-angle optical diffusers. Diffuser indicators of this type are illuminated by the light source (e.g. the sun) and tend to become bright as the light redirecting element approaches its nominal operating angle. At angles far from nominal, the positional reference diffusers may be dim or even not visible, but this typically would not be important since precision is frequently not required at those angles. But as the light redirecting element approaches nominal, the spots glow brightly and provide sharp positional references that can be centroided with high accuracy.

By way of another example, an optical proxy can be provided with a high precision region of ±2 degrees. This is the region over which very high performance may be desirable from such a positional proxy. By providing reference diffusers with a Gaussian intensity profile with a Full Width Half Max of 4 degrees, a very bright and clear reference mark will be created when operating in this high precision region.

Another kind of reference mark that is also contemplated is a retroreflector. In this case, a retroreflective material (often a film or sticker) can be placed on the light redirecting element and illuminated by an active source placed near the sensing camera 65.

Other types of indicator marks are also possible, including dark marks, or any other effective indicator.

Preferred embodiments of reference marks may have one or more advantageous structures and properties. For example, it may be desirable to have a reference mark whose intensity is relatively constant across a range of viewing angles, but then is much less or even zero outside that range. By virtue of having less intensity or even zero intensity outside that range of activity, the mark would distribute light mainly only within the defined range of activity. This helps to make the reference mark as bright as possible when viewed within the range of activity.

One embodiment of a reference that has this property has a uniform distribution of surface slopes over a range, corresponding to the angles over which the light is to be distributed, according the formula $$m = \tan(\theta/2)$$

where m is the slope of the reflecting surface with respect to the associated light reflecting element, and θ is the angle of the reflected light at normal incidence relative to the light reflecting element. One surface that has a uniform distribution of slopes over a range is one in which the slope changes continuously in a linear fashion according to the expression $$m(x) = ax$$

where a is an arbitrary constant. Then, taking note of the fact that the slope m of the surface is equal to the change in the surface height z over the change in translation x, the expression can be written in derivative notation according to the following formula:

$$\frac{dz}{dx} = ax$$

Integrating this derivative shows that one surface that implements this property is a parabola:

$$z(x) = \frac{a}{2}x^2$$

This is extended to a two-dimensional surface using partial derivatives, giving a surface according to the formula $$z(x, y) = \frac{a}{2}(x^2 + y^2)$$

Finally, given a desire to distribute light only over a range of angles, this equation can be limited according to the following expressions:

$$\left|\frac{\partial z}{\partial x}\right| \leq m_{max}$$

and $$\left|\frac{\partial z}{\partial y}\right| \leq m_{max}$$

This results in a three dimensional surface whose shape comprises a region of an elliptic paraboloid. Such a paraboloid shape can be concave or convex.

A reference reflector including such a paraboloid shape is desirable in many modes of practicing the present invention. Such a reflector has the useful property that it has a uniform distribution of angles over its surface. Also, it has some of the properties of an optical proxy in that the apparent source of a reflection off this surface varies as the angle of incidence of the incoming light varies. While this property is desirable in an optical proxy, it is less desirable in a reference mark whose function is to provide a fixed positional reference. Those skilled in the art refer to this property of a sensing device that provides a systematic measurement error as introducing a "bias" in the measurement it provides.

Figure 47:
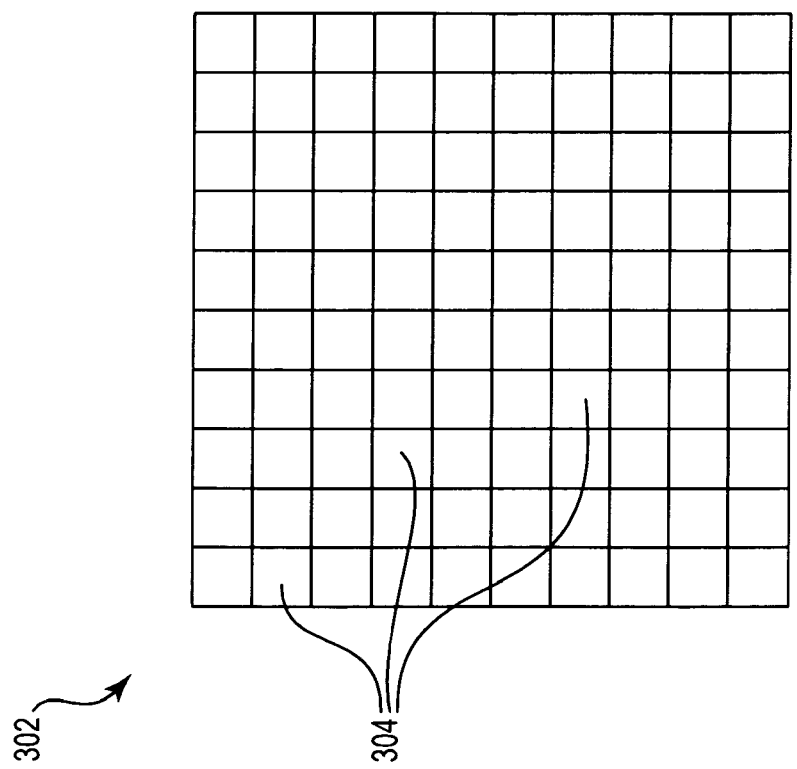
FIG. 47 shows a reference element formed from an array of parabolic surfaces.

To help mitigate this bias effect, a plurality of reflector elements each having a convex elliptic paraboloid shape can be arranged in an array such as is schematically shown by the 10×10 array 302 of FIG. 47. The resultant array is analogous to a "waffle" surface comprising a large number of these reflecting elements 304 that have been scaled to a small size so that the overall area of the array has the desired cumulative surface area desired for the reference mark. In FIG. 47, each element 304 is 10% of the single-celled reference mark's cell size in each dimension, or 1% of the single-celled reference mark's area.

This reference mark will produce 100 reflections. The apparent position of the aggregate reflection will be the mean location of those reflections. As the angle of the incident light changes, the motion of the 100 spots will be 1/10 of what it would be for the single-celled reference mark, reducing the bias by a factor of 10. A surface comprising a plurality of these elements 304 can thus help to provide a reference mark whose aggregate reflection has less positional variation than a mark of the same cumulative area formed from a single element.

Nonetheless, both kinds of reference marks may be useful embodiments. On the one hand, the many-celled embodiment tends to provide less positional variation. On the other hand, the single-celled embodiment would tend to produce a brighter focused spot, which may help an observer to be able to more readily distinguish the spot from the background.

A further variation on the waffle surface can reduce the bias effect even more, virtually eliminating it in principle. First, the present invention teaches that, in addition to a waffle design comprising a plurality of convex reflecting elements, an embodiment that instead provides an array comprising a plurality of concave reflecting elements would also work. Further, an embodiment providing a mix of convex and concave reflecting cones also would be suitable. Advantageously, the present invention teaches that an embodiment that provides convex and concave cones in substantially equal number will result in substantially zero net positional variation in the centroid of intensity from the reference mark, since the bias introduced by the convex cones tends to be offset by an equal and opposite bias from the concave cones. One particularly preferred embodiment, therefore, provides alternating convex and concave elements in a checkerboard pattern. Such a surface has an advantage that an array comprising only small numbers of cells (as few as four, or even two) could produce a surface with no net variation in centroid position.

Figure 48:
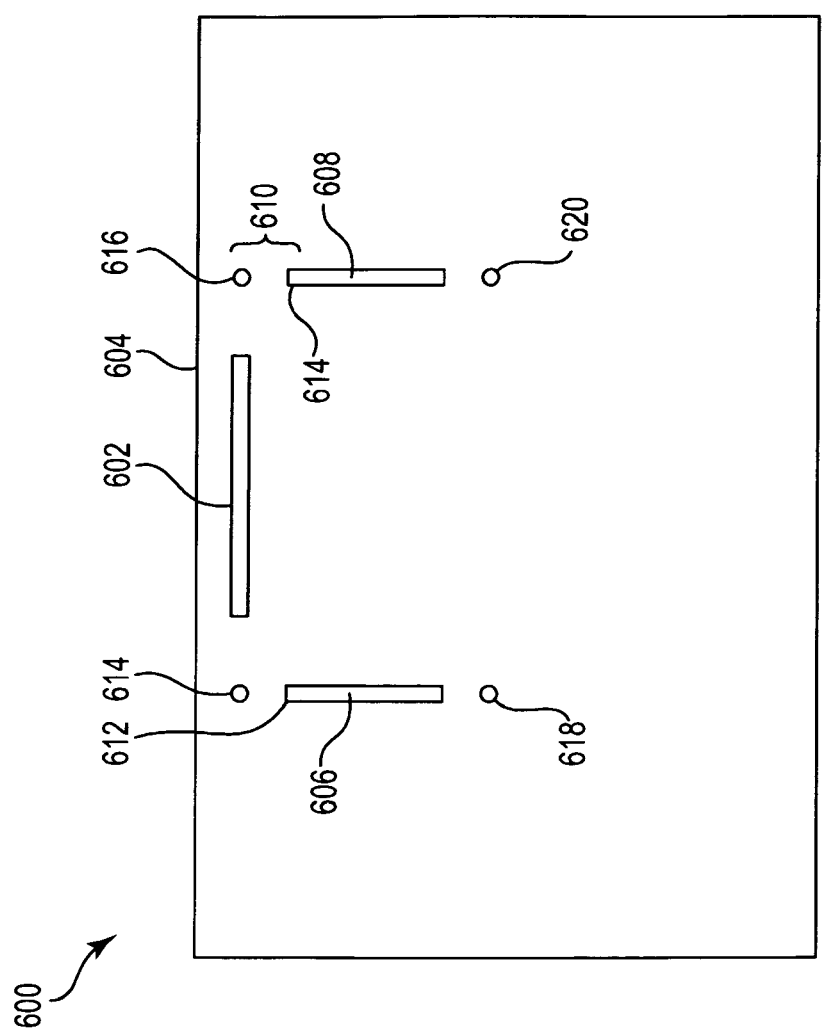
FIG. 48 shows a preferred embodiment of proxy placement on a reflector.

For heliostat applications, one particularly preferred embodiment of proxy placement on a reflector 600, including reference marks, is shown in FIG. 48. Proxy element 602 is mounted horizontally near the top edge 604. Proxy elements 606 and 608 are mounted vertically. A gap 610 exists between proxy element 602 and the top ends 612 and 614 of elements 606 and 608. The present embodiment provides proxies 606 and 608 in a vertical orientation to encode the vertical angle.

Reference marks 614 and 616 are provided near the top edge 604. Reference marks 618 and 620 are provided below elements 606 and 608. The layout as shown permits the sharing of reference marks among proxy elements. Reference mark 614 is shared by proxy elements 602 and 606 while mark 616 is shared by proxy elements 602 and 608. Marks 618 and 620 are not shared.

The layout of FIG. 48 is preferred in some embodiments of solar power plants, since the layout tends to provide excellent shadowing performance. First, the proxy elements 602, 606, and 608 are all generally located in the upper part of the reflector 600. This helps the proxy elements to be visible to the sensing camera (not shown), which in many embodiments is located lower on a tower (not shown) than the target (not shown). The camera may not have an unobstructed view of the bottom of the reflector 600 at all times.

Shadowing studies have shown that a narrow strip at the top of the reflector is nearly always visible to the sensing camera at nearly all daylight hours throughout the year. This embodiment thus places a horizontal proxy in this region. Shadowing studies have also shown that, in general, either the left half or right half of the reflector 600 is unshadowed most of the time, although at some extreme angles shadowing occurs. Nonetheless, the general notion of a pair of proxies, one on the left side and one on the right side, is a preferred layout. In a tip-tilt heliostat field, vertical proxies 606 and 608 may sometimes both be shadowed when the reflector 600 is tilted at extreme angles, but studies have shown that little energy production tends to occur at these angles, which tend to correspond to very early or very late in the day.

There are further variants on this type of positional optical proxy that take advantage of other optical properties of light to provide alternative or additional encoding. For example, by adding diffraction gratings of varying line spacings to the optical proxies, the color of the proxy beam will vary along with its position, providing an additional signal that can be used for any desirable purpose, such as calibration or improved precision.

Likewise, the same effect could be achieved by providing colored facets for a faceted proxy, with the color provided being a function of angle.

Alternatively, color could be used to distinguish between proxies that could otherwise be confused with one another. For example, in the case of closely spaced proxies as shown in FIG. 35, they could be made to provide different colored reflections (e.g. one red and one blue), making it easy to distinguish the two proxies in spite of their physical coincidence.

Another form of proxy provides facets at angles such that the proxy appears to flash on and off as it articulates, thus forming a digital optical encoder. By way of example, a proxy with facets aimed to reflect light at 0 degrees, 1 degree, 2 degrees, and so on, would flash on and off approximately every half degree when used in a solar application. When paired with a second proxy with reflecting facets at 0.5, 1.5, 2.5 degrees and so on, a quadrature encoder may be formed, and it becomes possible to make rather high precision angle measurements using standard quadrature techniques.

Other digital encoding techniques are also possible, including arbitrary schemes such as bar codes and the like.

Because optical proxies may be attached to heliostats that move in some modes of practice, the proxies present different apparent shapes to an observer as the heliostats articulate. For example, when a heliostat is lying nearly on its back, optical proxies mounted vertically on the heliostat would appear to be shorter than they actually are. Due to this foreshortening effect, the vertical proxies appear to be significantly shorter than the horizontal proxy(ies) on the reflector. Given a proxy observing system with a certain resolving power, this foreshortening will reduce its ability to determine the vertical angle of the heliostat in this scenario. In some applications, this can be well tolerated. Foreshortening studies indicate that severe foreshortening is uncommon in normal use. Studies further indicate that when foreshortening is present, it affects the vertical direction much more than the horizontal.

Figure 49:
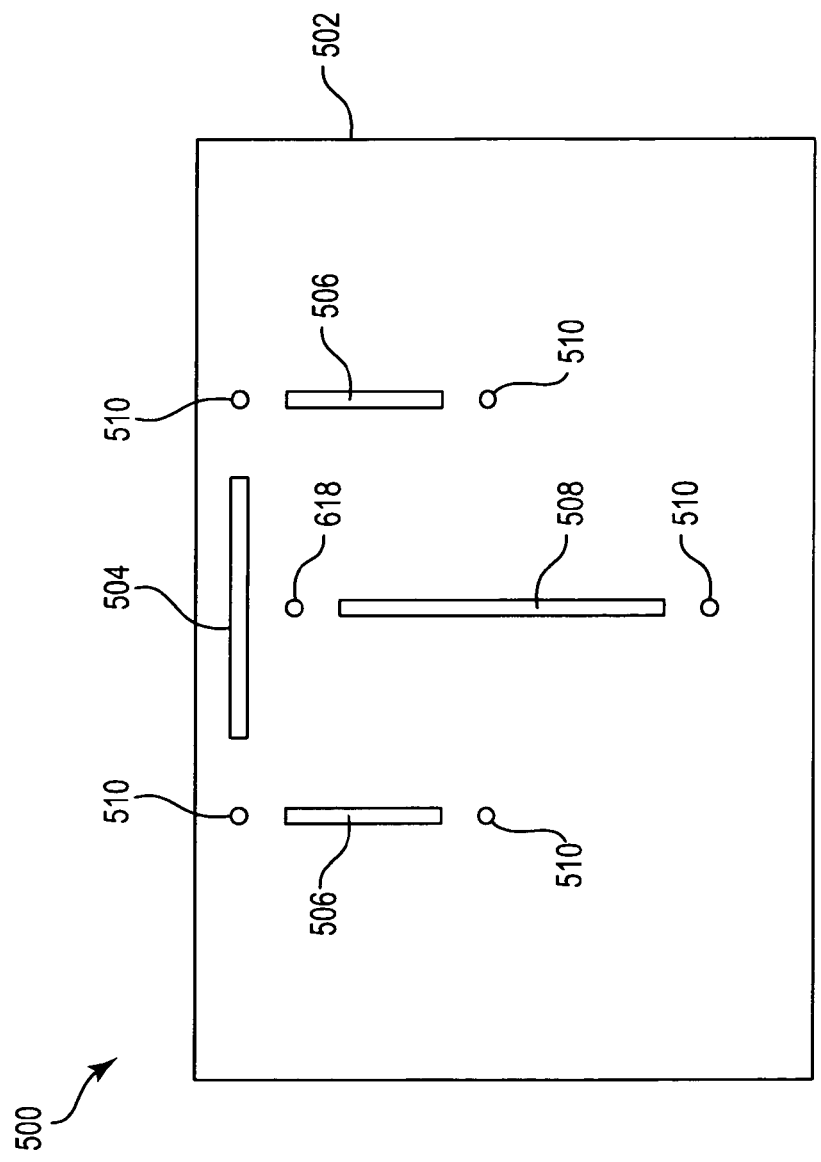
FIG. 49 shows a heliostat with a preferred embodiment of proxy placement on a reflector that addresses foreshortening effects.

In other applications, though, some mitigation of the foreshortening effect is desirable, especially for vertical proxies. One embodiment of a heliostat 500 that deals with this effect is shown in FIG. 49. Heliostat 500 includes mirror 502, horizontal proxy element 504, vertical proxy elements 506, extra long vertical proxy element 508 placed in the middle of mirror 502, and reference marks 510.

Proxy element 508 as shown is so long that its apparent length when foreshortened may be even longer than the un-foreshortened horizontal proxy 504. This degree of length is not necessary in many systems, but is shown to help illustrate the range of embodiments that are possible. This extra-long proxy 508 thus can help provide a degree of vertical resolution that is comparable to the resolution provided by the horizontal proxy 504, in spite of foreshortening. The extra-long proxy 508 has these two properties that are different from vertical proxies 506. Proxy 508 is in the center of the mirror 502, and it extends into the lower half of the mirror 502. In other embodiments, vertical proxies were not placed in this portion of the mirror, because the lower half of the mirror is frequently not visible to the proxy camera, since its view is blocked by other heliostats. Also, the center of the mirror is frequently shadowed.

However, detailed study of the foreshortening situation reveals that, at times when vertical foreshortening occurs, the whole of the mirror tends to become visible to the proxy camera, so the bottom half of the mirror becomes available for proxy placement. Also, at times when vertical foreshortening occurs, the center of the mirror tends to not be shadowed, so the center of the mirror becomes an excellent place to put a proxy. Thus, the embodiment shown in FIG. 49 provides for continued high-accuracy proxy sensing, even in the presence of foreshortening.

Many other heliostat embodiments are possible that take advantage of the region of mirror that tends to be unshadowed during foreshortening. Any convenient proxy location and shape will work. For example, a horizontal "twisty" type proxy (such as proxy 201 from FIG. 39) can be placed in the center of mirror 502 instead of the extra long proxy 508. This would provide for vertical angle sensing with a horizontal optic.

Because the sun is so bright, the bright light of the sun competes with the light information produced by optical proxies and reference marks. This can make it difficult in some instances to obtain optical information from the proxies and reference marks. Consequently, the present invention preferably implements narrow-band observation techniques for observing proxy and/or reference mark information in order to make the system more tolerant of variations in background light. For example, filtering techniques can be used to selectively block the background light or other interfering light sources, making the proxies and reference marks easier to see. Because the sky is blue, many preferred embodiments can provide for a red- or infrared-colored filter in front of sensing camera 65, thus serving to reject the background blue sky while passing a strong image of the optical information from the proxies and reference marks.

A wide range of filters can be used. Exemplary filters are those that selectively pass just portion(s) of the optical spectrum, with bandwidths from as narrow as 1 nm to as wide as 200 nm, preferably as narrow as 1 nm to as wide as 100 nm, more preferably as narrow as 1 nm to as wide as 30 nm. The light passed by filters with sufficiently narrow bandwidth can begin to approximate laser light for some purposes, which can have many useful properties. Especially, being nearly monochromatic helps to enable the use of optical elements and techniques that work with monochromatic light.

Preferred embodiments of the present invention for sun-tracking applications provide filters with passbands in the red or near-infrared wavelengths, e.g. with center wavelengths in the region from 600 nm to 1000 nm. By way of example, one particularly useful embodiment of the present invention provides an optical filter in front of a proxy sensing camera with a passband of 1 nm to 100 nm, preferably 10 nm, centered on the 900 nm wavelength, such as the model 20BPF10-900 filter from Newport Corporation. Although the transmission of the narrowband filter is typically low (e.g. 45% for the Newport 20BPF10-900), this is of no concern in a sun-tracking application with an abundance of photons.

The wavelength region from 600 nm to 1000 nm has several desirable properties. First, the sky is substantially dark at these wavelengths, helping the proxy sensing camera to not be confused by the blue sky. Secondly, the wavelengths are detectable by typical silicon camera detectors. This is an advantage because such detectors and cameras tend to be available at low cost.

One advantage of using a narrow-band filter (at any wavelength) is that it is much easier to design an optical system (e.g. a camera lens) to perform well over a narrow wavelength band (e.g. 900 nm±5 nm) than over the entire visible spectrum (400 nm-700 nm). This translates to significantly lower cost. In particular, at very narrow bandwidths, options that are typically only available to laser optics, like Fresnel lenses and zone plates, can deliver images of reasonable quality. Some embodiments of the present invention use Fresnel lenses and/or zone plates in their imaging lenses. This can help to enable a system with lower cost, by reducing the cost of imaging elements in a heliostat system that includes the present invention.

Although red and near infrared wavelengths are preferred, other narrow-band filters (e.g. blue, green, or yellow) still may be useful embodiments in that they still offer the opportunity for simpler or lower cost optics, and the rejection of a portion of the sky background. Also, in non-sun-tracking applications, other wavelengths may be preferred.

It is also noted that sharp edges of the Fresnel-ized optics shown in the figures can be challenging to manufacture with precision. While the present invention is generally highly tolerant to a softening of these features, embodiments that avoid sharp edges may nonetheless be desirable in some cases.

Building on the concepts shown in FIGS. 34 and 35, the present invention appreciates that it may be acceptable to provide an optical proxy whose encoding of position vs. angle is not unique—that is, the same position might encode two different angles. If the angles encoded by that position are widely separated, then it is likely that some auxiliary information could be used to readily distinguish between them.

Figure 43:
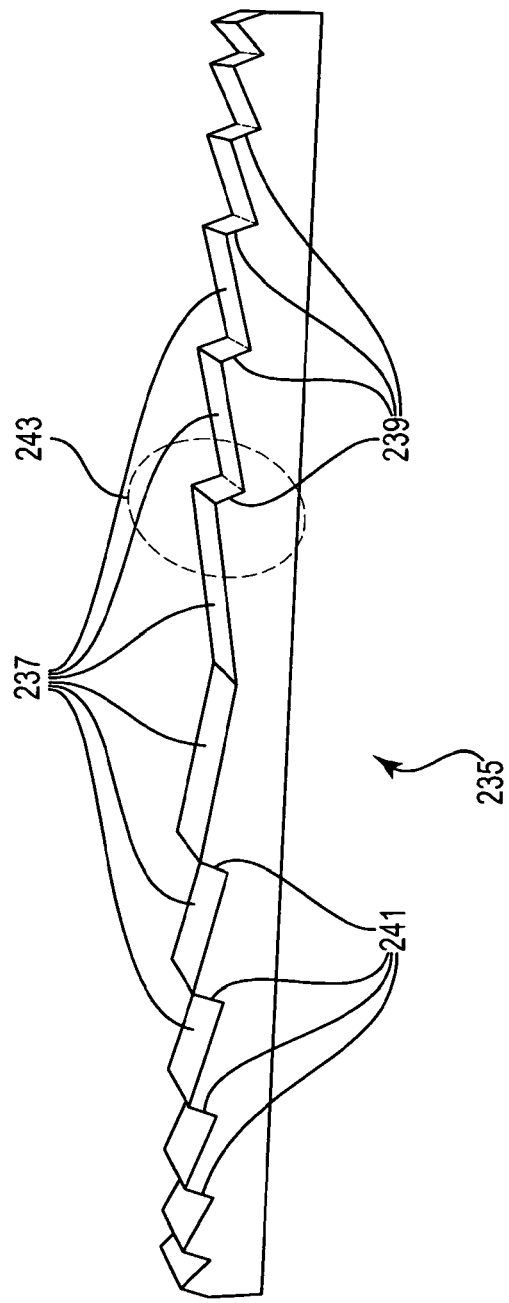
FIG. 43 shows a two-sided Fresnel-ized optical proxy, with less sharp corners. The vertical dimension of the optical proxy is exaggerated slightly for clarity.

A limited one-dimensional proxy according to this principle is shown in FIG. 43. The limited proxy 235 comprises three sets of facets, labeled 237, 239, and 241. Facet set 237 is substantially the same as the facets 5 of limited proxy 1 of FIG. 2, and functions the same. However, compared to limited proxy 1 of FIG. 1, limited proxy 235 has angled teeth instead of vertical teeth, so that instead of vertical walls, there are additional angled facets 239, which tend to reflect light far to the right, and angled facets 237, which tend to reflect light far to the left.

In preferred embodiments of optical proxies, facets tend to be of rather small dimension, such as small as 1 mm or even smaller, often smaller than the size of the image that is formed by the proxy. When light appears to be coming from a certain region of a proxy 235—such as the region 243 indicated by the dotted line—it may tend to span multiple facets, and it may be impossible to tell exactly which facet it is coming from.

As such, light coming from region 243 could be coming either from some of the facets 237 or from some of the facets 239; thus, position 243 encodes two possible positions of the light source, one, corresponding to facets 239, is to the far right, while the other, corresponding to facets 237, is slightly to the left.

Referring back to the preferred optical proxy of FIG. 25, the present invention teaches that the angle of the facets of proxy 115 as a function of x position is a key parameter for controlling the encoding of angle into position. On the other hand, the angling of facets such as 119, 121, and 123 in the y direction can be provided simply to provide for a wider range of operation of the proxy in the y direction. In fact, with the structure shown in FIG. 25, proxy 115 circumstantially provides a low-resolution encoding of tilts in the y direction (i.e. about the x axis) due to the monotonically increasing slope of facets 119, 121, and 123, in addition to its intended encoding of tilts in the x direction (i.e. about the y axis), but this circumstantial encoding is not particularly desired. In fact, it could lead to small bias errors in the x encoding, if there is any systematic variation in y, such as brightness of the facets. Bias errors can also result from coupling of the x and y responses of such a proxy.

Figure 44:
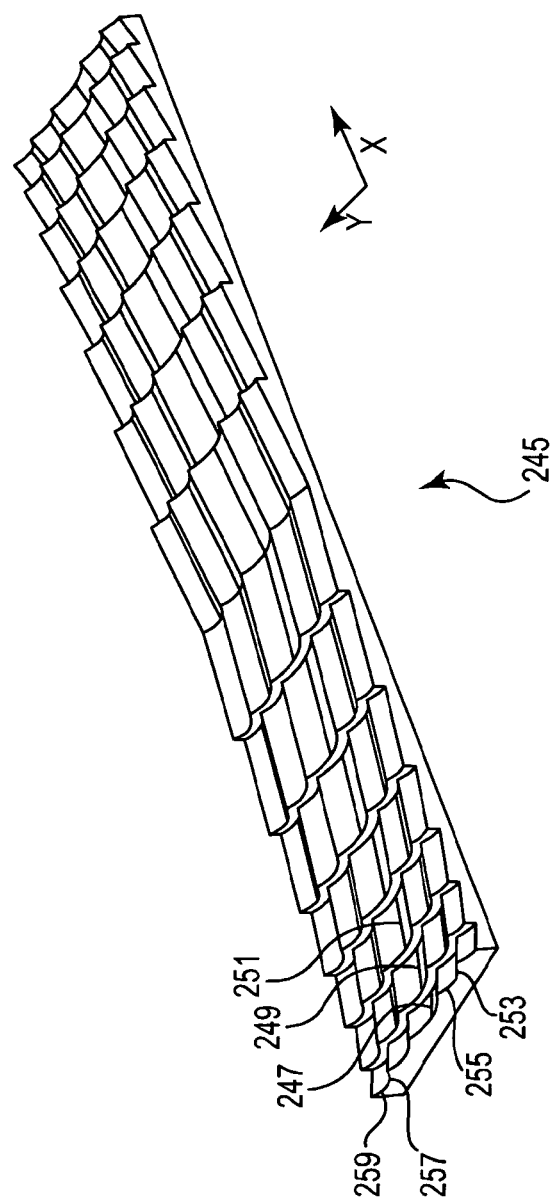
FIG. 44 shows a Fresnel-ized optical proxy with facets rearranged in the y direction to help make less sharp corners. The vertical dimension of the optical proxy is exaggerated slightly for clarity.

The present invention teaches, therefore, that it may be preferred to randomize the order of the facets in the y direction. Further, following the teachings associated with the discussion of FIG. 43 that it may be desirable to avoid sharp edges in the design, the present invention teaches that it may be desirable to alternate "up" and "down" facets in the y direction. Such a proxy 245 is shown in FIG. 44. In the x direction, the usual facet structure is provided for encoding angle vs. position, as typified by facets 247, 249, 251 and so on.

In the y direction, facets 247, 249, and 251 have regions that are nominally flat, helping the proxy to produce a signal at a nominal zero y tilt.

Likewise, facets 247, 253, 255, 257, and 259 all can have the same nominal x tilt, providing the desired encoding of position vs. angle at that point on the proxy. However, these facets all may have different y tilts, to provide a wide range of operation over y tilt angles. Although it is not required by the invention, this embodiment provides facets in matched plus/minus pairs. The y slopes of facets 253 and 255 have a same magnitude but opposite sign. Similarly, facets 257 and 259 have slopes of a second magnitude, but again with opposite signs. By collecting together these pairs, sharp edges are avoided in the y direction, and the facets are somewhat "stirred up" in the y direction to help to start to eliminate systematic motions of the beam in the y direction when y tilts occur.

Nonetheless, some systematic motion still can occur with this embodiment, so the present invention teaches that some desirable embodiments instead randomize the order of the facets in the y direction, providing the full range of y tilts that are required, but in a random order, with the random order possibly even also varying as a function of x position, so as to completely "stir up" the facets, resulting in the elimination of systematic motions.

Figure 45:
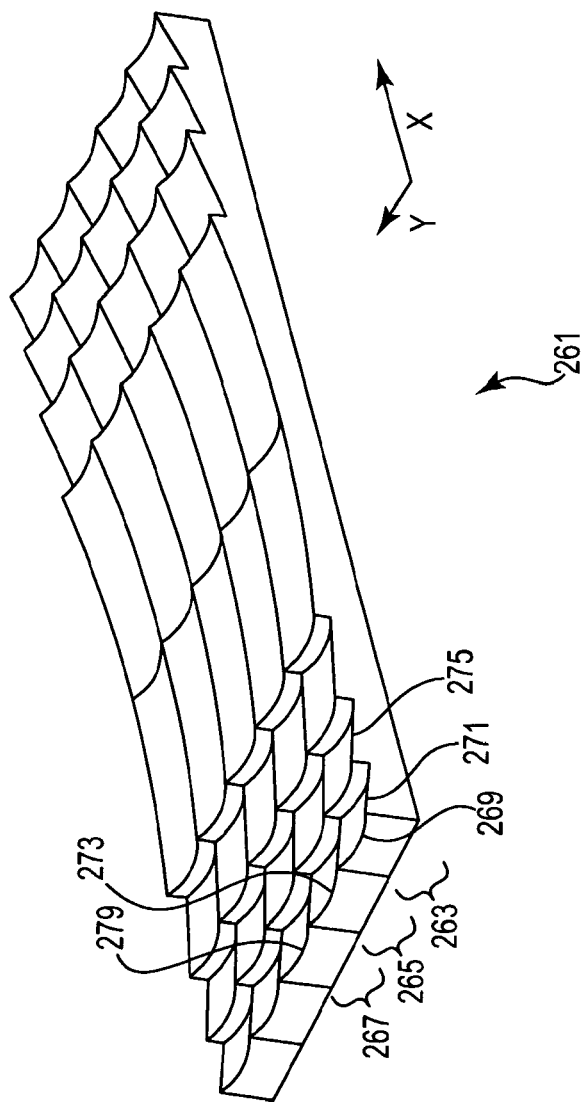
FIG. 45 shows an optical proxy with facets that are concave in the y direction. The vertical dimension of the optical proxy is exaggerated slightly for clarity.

Another arrangement of y tilt angles in shown by proxy 261 in FIG. 45. This embodiment comprises a plurality of fully functional individual proxies 263, 265, and 267, and so on, arranged parallel to each other. In many embodiments, these individual proxies may be quite narrow in the y direction, as narrow as 1 cm, or even as narrow as 1 mm, or even narrower. The proxies implement an x encoding in their facets in the x direction, as evidenced by the x tilt and curvature of facets 271, 275, and so on. They implement a desired y tilt range by providing y curvature to their facets, as evidenced by the curvature of edges 269 and 273. Each facet thus resembles a narrow trough. If the y dimension of the individual proxies is small, the thickness of the proxy can remain small, even though the individual proxies are not faceted in the y direction.

When taken together, the individual proxies 263, 265, and 267 form an aggregate proxy 261, with a structure that is substantially periodic in the y direction, with edge 279 being substantially identical to edge 269, and so on.

Considering the individual proxies, such as individual proxy 263, as the proxy is tilted in y, the position of the light source appears to move in the y direction, just within the facet itself. For example, when viewed from an x angle such that edge 269 is illuminated, reflection from facet 271 will tend to move back and forth along edge 269 as the individual proxy is tilted in y. However, if the size of the individual proxy in the y direction is small, this physical motion is also small. In many preferred embodiments, this motion is actually imperceptible, being much less than a pixel as seen by sensing camera 65.

Further, when a spot from individual proxy 263 is combined with a spot from individual proxies 265, 267, and so on, the resulting spots will appear to be a line (except under extreme magnification). So the net effect of the aggregate proxy is to reflect a vertical line whose x position moves as the proxy tilts in x (i.e. about the y axis).

FIG. 45 shows shapes for the various facets that are concave in both x and y. However, any combination of convex or concave facets may be used. Making the facets convex in y has no discernible effect on the function of the proxy, while making the facets convex in x simply inverts the sign of the encoding of the proxy.

Figure 46:
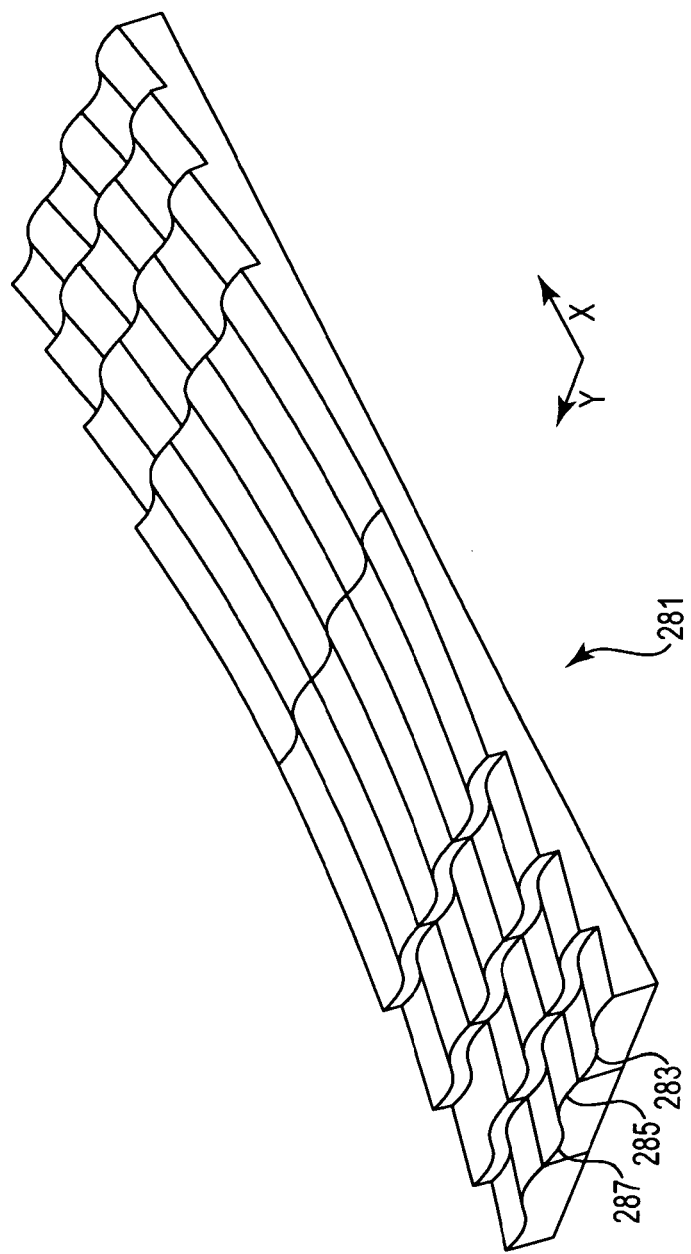
FIG. 46 shows an optical proxy with facets that alternate between convex and concave in the y direction. The vertical dimension of the optical proxy is exaggerated slightly for clarity.

While it is not a significant concern, it is nonetheless desirable if possible to reduce the number of sharp corners in the design. The present invention teaches that the sharp corners between facets in the y direction can be eliminated by alternating between convex and concave facets in the y direction, as show in FIG. 46. FIG. 46 illustrates optical proxy 281, with alternating concave/convex facets in y. Facet 283 is shown as being concave in y, connecting seamlessly to facet 285 which is convex in y, which connects seamlessly to facet 287 which is again concave in y, and so on.

In fact, while the figure shows 283, 285, and 287 as individual facets for clarity, there is no separation between them, and they really form just one large "superfacet" that has a wavy surface in the y direction. Regarding this convex/concave alternation in the y direction, the present invention teaches that the bias mitigation teachings associated with the waffle reference marks, discussed above, apply equally to a proxy of the type shown in FIG. 46. First, bias can be reduced by introducing a large number of these convex/concave facets in the y direction. Secondly, bias can be virtually eliminated by providing an equal number of convex and concave facets in the y direction, including as few as one concave facet and one convex facet. Preferred embodiments therefore provide equal numbers of convex and concave facets. Note that the facets need not be wholly intact—one preferred embodiment provides half a convex facet, next to one full concave facet, followed by another half of a convex facet.

All patents, patent applications, and publications cited herein are incorporated by reference as if individually incorporated. Unless otherwise indicated, all parts and percentages are by weight and all molecular weights are number average molecular weights. The foregoing detailed description has been given for clarity of understanding only. No unnecessary limitations are to be understood therefrom. The invention is not limited to the exact details shown and described, for variations obvious to one skilled in the art will be included within the invention defined by the claims.

What is claimed is:

1. A heliostat system that redirects and concentrates sunlight onto a target, comprising:
   (a) an imaging device;
   (b) a plurality of heliostats, each heliostat comprising:
      i) a light redirecting element that redirects a first portion of incident sunlight;
      ii) at least one optical proxy associated with the light redirecting element such that the optical proxy articulates together with the light redirecting element, wherein the optical proxy redirects a second portion of incident sunlight as a proxy for the redirected, first portion of the incident sunlight, and wherein the optical proxy comprises first and second light redirecting, optical surface portions sloped at different angles to the incident sunlight such that an observed position from which the redirected, second portion of the incident sunlight appears to emanate from the optical proxy correlates to the aim of the light redirecting element associated with the proxy; and
   (c) a control system that uses the position of the redirected, second portion of the incident sunlight on the optical proxy to aim the redirected sunlight onto the target.

2. A method of concentrating sunlight, comprising the steps of:
   (a) providing a light redirecting element that redirects a first portion of incident sunlight;
   (b) providing at least one optical proxy associated with the light redirecting element such that the optical proxy articulates together with the light redirecting element, wherein the optical proxy redirects a second portion of incident sunlight as a proxy for the redirected, first portion of the incident sunlight, and wherein the optical proxy comprises first and second light redirecting, optical surface portions sloped at different angles to the incident sunlight such that an observed position from which the redirected, second portion of the incident sunlight appears to emanate from the at least one optical proxy correlates to the aim of the light redirecting element associated with the proxy;
   (c) sensing position characteristics of light on the at least one optical proxy;
   (d) using the sensed information to aim the light redirecting element in a manner that redirects the sunlight at a target; and
   (e) repeating steps (a) through (d) for at least one additional light redirecting element and at least one additional optical proxy associated with the at least one additional light redirecting element.

3. The method of claim 2, wherein the optical proxy comprises a surface having a first surface portion and a plurality of additional surface portions whose slope increases as the distance from the first surface portion increases.

4. The method of claim 2, wherein changes in the degree of rotation of the optical proxy about an axis transverse to a length of the proxy causes the position of a light spot on the proxy to change.

5. The method of claim 2, wherein the optical proxy has a surface having an interior surface portion and wherein the slope of the surface increases outward from the interior surface portion with increasing radius from the interior surface portion.

6. The method of claim 2, wherein the optical proxy comprises a plurality of concentric surface facets, each facet having an increasing slope with increasing distance from an interior surface portion of the optical proxy.

7. The method of claim 2, wherein the optical proxy comprises at least one convex surface portion and at least one concave surface portion.

8. The method of claim 2, wherein the optical proxy comprises a surface effective to non-linearly encode the aim of the light redirected element as a function of the position characteristics of light on the optical proxy.

9. The method of claim 2, wherein the optical proxy comprises an array of surface facets.

10. The method of claim 9, wherein the surface facets comprise different slopes.

11. The method of claim 2, wherein the optical proxy comprises a surface having a twisted contour.

12. The method of claim 2, wherein first and second optical proxies are mounted on the light redirecting element in a manner such that the first optical proxy encodes the aim of the light redirecting element with respect to a first axis and the second optical proxy encodes the aim of the light redirecting element with respect to a second axis.

13. The method of claim 2, wherein a first optical proxy is mounted on the light redirecting element substantially parallel and proximal to a top edge of the light redirecting element; and second and third optical proxies are mounted on the light redirecting element non-parallel to the first optical proxy.

14. The method of claim 2, wherein the surface of the optical proxy is Fresnel-ized.

15. The method of claim 2, further comprising at least one reference mark positioned in a manner such that the optical information provided by the at least one reference mark helps to sense position characteristics on the at least one optical proxy.

16. The method of claim 15, wherein a reference mark comprises a surface contour comprising an elliptic paraboloid shape.

17. The method of claim 15, wherein a reference mark comprises an array of elements.

18. The method of claim 2, wherein step (c) comprises observing the optical proxy through a filter that selectively passes one or more spectral bandwidth portions of redirected sunlight.

19. A method of redirecting sunlight, comprising the steps of:
   (a) providing a light redirecting element that redirects a first portion of the incident sunlight;
   (b) providing at least one optical proxy associated with the light redirecting element such that the optical proxy articulates together with the light redirecting element, wherein the optical proxy redirects a second portion of incident sunlight as a proxy for the redirected, first portion of the incident sunlight, and wherein the optical proxy comprises first and second light redirecting, optical surface portions sloped at different angles to the incident sunlight such that an observed position from which the redirected, second portion of the incident sunlight appears to emanate from the at least one optical proxy correlates to the aim of the redirected first portion of the sunlight redirected by the light redirecting element associated with the proxy;
   (c) obtaining information indicative of a position of a light spot on the at least one optical proxy; and
   (d) using the position information to aim at least one light redirecting element associated with the at least one optical proxy in a manner that redirects the sunlight at a target.

20. A heliostat, comprising:
(a) a light redirecting element; and
(b) at least one optical proxy associated with the light redirecting element such that the optical proxy articulates together with the light redirecting element, wherein the optical proxy redirects a second portion of incident sunlight as a proxy for the redirected, first portion of the incident sunlight, and wherein the optical proxy comprises first and second light redirecting, optical surface portions sloped at different angles to the incident sunlight such that an observed position from which the redirected, second portion of the incident sunlight appears to emanate from the at least one optical proxy, correlates to the aim of the light redirecting element associated with the proxy.

* * * * *